United States Patent [19]
Tanaka et al.

[11] Patent Number: 6,060,338
[45] Date of Patent: May 9, 2000

[54] METHOD OF MAKING A FIELD EFFECT TRANSISTOR

[75] Inventors: Toshihiko Tanaka; Syuji Doi, both of Takatsuki; Hiroshi Koezuka, Amagasaki; Akira Tsumura, Amagasaki; Hiroyuki Fuchigami, Amagasaki, all of Japan

[73] Assignees: Mitsubishi Denki Kabushiki Kaisha, Tokyo; Sumitomo Chemical Company, Limited, Osaka, both of Japan

[21] Appl. No.: 09/228,936

[22] Filed: Jan. 12, 1999

Related U.S. Application Data

[62] Continuation of application No. 08/835,634, Apr. 10, 1997, Pat. No. 5,892,244, which is a continuation of application No. 07/965,536, Oct. 23, 1992, abandoned, which is a continuation of application No. 07/576,437, filed as application No. PCT/JP90/00017, Jan. 10, 1990, abandoned.

[30] Foreign Application Priority Data

Jan. 10, 1989 [JP] Japan ........................................ 1-4177

[51] Int. Cl.⁷ .................................................. H01L 21/335
[52] U.S. Cl. ........................... 438/99; 438/149; 438/151; 257/40; 257/72
[58] Field of Search .................... 438/22, 30, 99, 438/149, 151; 257/40, 72

[56] References Cited

U.S. PATENT DOCUMENTS

| | | |
|---|---|---|
| 4,808,681 | 2/1989 | Harper et al. . |
| 4,862,234 | 8/1989 | Koden .................................. 357/23.7 |
| 4,873,556 | 10/1989 | Hyodo et al. ............................ 357/8 |
| 4,900,782 | 2/1990 | Han et al. . |
| 4,923,288 | 5/1990 | Allen et al. . |
| 5,107,308 | 4/1992 | Koezuka et al. ........................ 357/8 |
| 5,500,537 | 3/1996 | Tsumura et al. ....................... 257/40 |

FOREIGN PATENT DOCUMENTS

| | | |
|---|---|---|
| 62-85467 | 4/1987 | Japan . |
| 63-14472 | 1/1988 | Japan . |
| 63-76378 | 4/1988 | Japan . |
| 1259563 | 10/1989 | Japan . |
| 1259564 | 10/1989 | Japan . |

OTHER PUBLICATIONS

Lieser et al., "Structure, Phase Transitions And Polymerizability Of Multilayers Of Some Diacetylene Monocarboxylic Acids", Thin Solid Films, vol. 68, 1980, pp. 77–90.

Kan et al., "Langmuir–Blodgett Film Metal/Insulator/Semiconductor Structures On Narrow Band Gap Semiconductors", Thin Solid Films, vol. 99, 1983, pp. 281–296.

Tsumura et al., "Polythiophene Field–Effect Transistor: Its Characteristics And Operation Mechanism", Synthetic Metals, vol. 25, 1988, pp. 11–23.

Reynolds, "Advances In The Chemistry Of Conducting Organic Polymers: A Review", Journal of Molecular Electronics, vol. 2, 1986, pp. 1–21.

Jen et al., "Highly–Conducting, Poly(2,5–Thienylene Vinylene) Prepared Via A Soluble Precursor Polymer", Journal of the Chemical Socity, Chemical Communications, 1987, pp. 309–311.

Sze, "Semiconductor Devices Physics And Technology", John Wiley & Sons, 1985, pp. 1 and 38.

*Primary Examiner*—Charles Bowers
*Assistant Examiner*—K Christianson
*Attorney, Agent, or Firm*—Leydig, Voit & Mayer, Ltd.

[57] ABSTRACT

A method of fabricating a field effect transistor including forming a gate electrode on an electrically insulating substrate; forming an electrically insulating film on the substrate covering the gate electrode; forming source and drain electrodes on the electrically insulating film on opposite sides of the gate electrode; forming a semiconducting film of a π-conjugated polymer on the source and drain electrodes and on the electrically insulating film between the source and drain electrodes.

20 Claims, 13 Drawing Sheets

METHOD OF MAKING A FIELD EFFECT TRANSISTOR

This disclosure is a continuation of patent application Ser. No. 08/835,634, filed on Apr. 10, 1997, now U.S. Pat. No. 5,892,244 which is a continuation of prior patent application Ser. No. 07/965,536, filed on Oct. 23, 1992, now abandoned, which is a continuation of prior patent application Ser. No. 07/576,437, filed on Oct. 24, 1990 now abandoned, which is a 371 of PCT/JP90/00017 filed Jan. 10, 1990.

TECHNICAL FIELD

The present invention relates to a field effect transistor (referred to as an FET hereinafter) using an organic semiconductor and a liquid crystal display apparatus using the same as a drive element.

BACKGROUND ART

Monocrystalline silicon and GaAs are used in practical FETs. However, these materials are expensive, and the process for manufacturing the FETs is very complicated. In addition, the area of an FET is limited by the size of a silicon or gallium arsenide wafer. For example, when an active drive element used in a wide screen liquid crystal display element is manufactured, there are substantial restrictions on costs and area when a silicon or gallium arsenide wafer is used. Because of such restrictions, when an FET is used as a drive element in a liquid crystal display, a thin film transistor using amorphous silicon is presently used. However, in a thin film transistor using amorphous silicon, it becomes increasingly difficult to manufacture many elements uniformly on a plane surface at low cost as the display element area is increased. Thus, recently, it has been proposed that FETs be manufactured using an organic semiconductor material. Among organic semiconductor materials, those using a π-conjugated polymer are especially useful because they are easily processed, which is a characteristic of a polymer material, and area can be easily increased (see Japanese Patent Publication 62-85224).

It is thought that a π-conjugated polymer, whose chemical structure includes a conjugate double bond or triple bond, has a band structure comprising a valence band, a conduction band, and a forbidden band separating the valence and conduction bands which is formed by overlapping of π-electron orbits. The forbidden band of the π-conjugated polymer is mostly within a range of 1 to 4 Ev which varies with the material. Therefore, the π-conjugated polymer itself has the electrical conductivity of an insulator or close to it. However, charge carriers are generated by removing electrons from the valence band (oxidation) chemically, electrochemically, physically, or the like or by implanting (referred to as doping hereinafter) electrons into the conduction band (reduction). As a result, it is possible to vary electrical conductivity over a large range, from insulating to metallic conduction, by controlling the amount of doping. The π-conjugated polymer obtained by an oxidation reaction is p-type and by a reduction reaction is n-type. This result is similar to addition of dopant impurities to an inorganic semiconductor. Thus, it is possible to manufacture various semiconductor elements using the π-conjugated polymer as a semiconductor material.

It is known that polyacetylene can be used as a π-conjugated polymer in an FET (Journal of Applied Physics, Volume 54, page 3255, 1983). FIG. 15 is a sectional view showing a conventional FET using polyacetylene. In this figure, reference numeral 1 designates a glass substrate, reference numeral 2 designates an aluminum gate electrode, reference numeral 3 designates a polysiloxane insulating film, reference numeral 4 designates a polyacetylene semiconductor layer, and reference numerals 5 and 6 designate gold source and drain electrodes, respectively.

In operation of the polyacetylene FET, when a voltage is applied between the source electrode 5 and the drain electrode 6, a current flows through the polyacetylene film 4. When a voltage is applied to the gate electrode 2 disposed on the glass substrate 1 and separated from the polyacetylene film 4 by the insulating film 3, the electrical conductivity of the polyacetylene film 4 can be varied by the resulting electric field so that the current flow between the source and drain can be controlled. It is thought that the width of a depletion layer in the polyacetylene film 4 adjacent to the insulating film 3 varies with the voltage applied to the gate electrode 2 and thereby the area of a current channel varies. However, the amount of the current flow between the source and drain that can be varied by the gate voltage is small in this FET.

In other FETs, the π-conjugated polymer is poly (N-methylpyrrole) (Chemistry Letters, page 863, 1986) and polythiophene (Applied Physics Letters, Volume 49, page 1210, 1986). FIG. 16 is a sectional view of an FET in which poly (N-methylpyrrole) or polythiophene is used as a semiconductor layer. In this figure, reference numeral 3 is a silicon oxide insulating film, reference numeral 4 is a poly (N-methylpyrrole) or polythiophene semiconductor layer, reference numerals 5 and 6 are gold source and drain electrodes, respectively, reference numeral 1 is a silicon substrate and gate electrode, and reference numeral 2 is a metal making ohmic contact to the silicon substrate 1. When poly (N-methylpyrrole) is used as the semiconductor layer, a current flowing between the source electrode 5 and the drain electrode 6 through the semiconductor layer 4 is only slightly controlled by the gate voltage, so there is no practical value in this FET.

On the other hand, when polythiophene is used as the semiconductor layer, the current flowing between the source electrode 5 and the drain electrode 6 through the semiconductor layer 4 can be modulated 100 to 1000-fold by the gate voltage. However, since polythiophene is formed by electrochemical polymerization in the prior art, it is very difficult to manufacture many uniform FETs at the same time.

Thus, the current between the source and drain which can be modulated by the gate voltage is too small in an FET in which polyacetylene or poly (N-methylpyrrole) is used as the semiconductor layer. In addition, although the current between the source and drain can be highly modulated by the gate voltage in an FET using polythiophene as the semiconductor layer and the FET is highly stable, since the FET is manufactured by forming a polythiophene film directly on the substrate by electrochemical polymerization, it is difficult to manufacture many uniform FETs on a large substrate at the same time, which is a problem.

DISCLOSURE OF INVENTION

In an FET in accordance with the present invention, a π-conjugated polymer film semiconductor layer is formed by first forming a π-conjugated polymer precursor film using a π-conjugated polymer precursor which is soluble in a solvent and then changing the precursor polymer film to the π-conjugated polymer film. In a liquid crystal display apparatus in accordance with the present invention, the FET is used as an active drive element therein.

In the present invention, instead of directly forming the π-conjugated polymer film by a method such as electrochemical polymerization, the π-conjugated polymer precursor film is formed from a π-conjugated polymer precursor which is soluble in a solvent, and then this precursor polymer film is changed to the π-conjugated polymer film. By using this π-conjugated polymer film as the semiconductor layer, the process for manufacturing the element is significantly simpler. As a result, it is possible to manufacture many FETs on a large area substrate at the same time and at low cost, to stably operate all of the manufactured FETs, and to highly modulate a current flowing between the source and drain with a gate voltage. In addition, when the FET is used as a drive element in a liquid crystal display apparatus, the area can easily be increased and a highly functional liquid crystal display apparatus can be manufactured at low cost.

In an FET in accordance with another aspect of the invention, the π-conjugated polymer film semiconductor layer is formed by first forming a Langmuir-Blodgett (referred to as LB hereinafter) film of a π-conjugated polymer precursor using a π-conjugated polymer precursor which is soluble in a solvent, and then changing this LB film of the precursor polymer to an LB film (although this LB film is an organic thin film, it is referred to as the LB film in a broad sense) of the π-conjugated polymer. In addition, in a liquid crystal display apparatus in accordance with the invention, the FET is used as an active drive element.

According to still another aspect of the invention, laminated films, comprising a semiconductor layer of the π-conjugated polymer obtained from a precursor which is soluble in a solvent and an acid giving film which produces an acid in a reaction in which the above π-conjugated polymer is obtained from a precursor which is soluble in a solvent, are sandwiched by the source electrode and the drain electrode. As a result, the π-conjugated polymer precursor film can be effectively changed to the π-conjugated polymer film, and a current flow between the source and drain can be highly modulated by a gate voltage.

BRIEF DESCRIPTION OF THE DRAWINGS

The same reference numerals are used in all the figures to designate the same or corresponding parts.

BEST MODE FOR CARRYING OUT THE INVENTION

Figure 1:
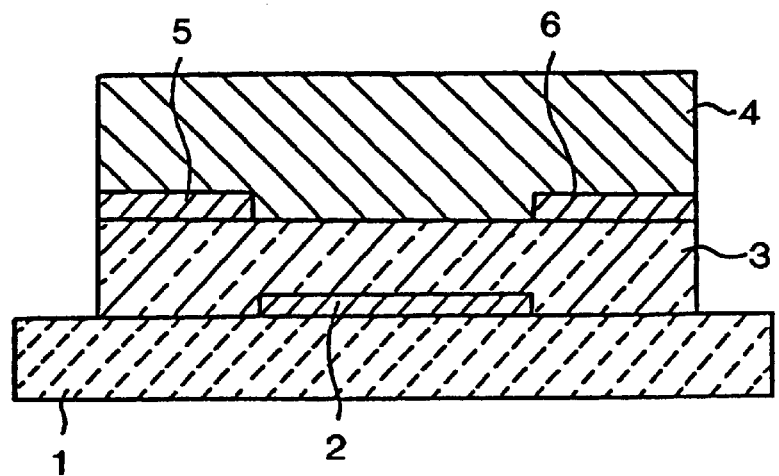
FIG. 1 is a sectional view showing an FET in accordance with an embodiment of the present invention.

FIG. 1 is a view of an example of an FET in accordance with the present invention. In FIG. 1, reference numeral 1 designates a substrate, reference numeral 2 designates a gate electrode disposed on the substrate 1, reference numeral 3 designates an insulating film, reference numeral 4 designates a π-conjugated polymer film or its LB film as a semiconductor layer, and reference numerals 5 and 6 designate source and drain electrodes, respectively.

Figure 2:
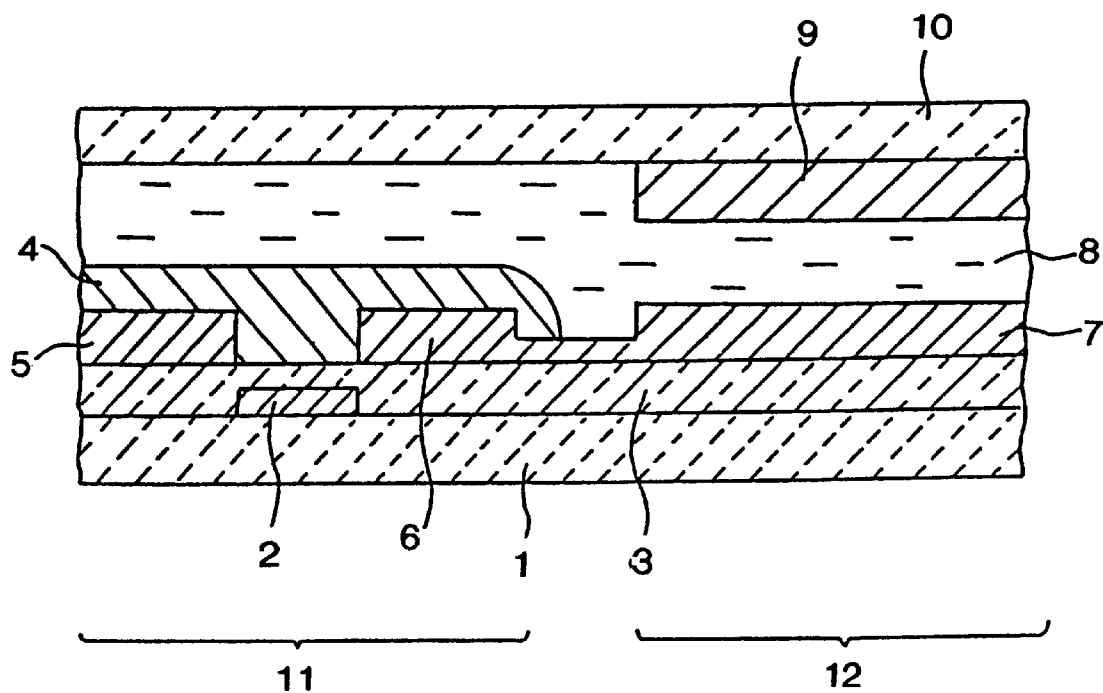
FIG. 2 is a sectional view of one pixel of a liquid crystal display apparatus in accordance with an embodiment of the present invention.

FIG. 2 is a sectional view showing an example of a liquid crystal display apparatus in accordance with the present invention. In FIG. 2, reference numeral 1 designates a substrate, reference numeral 2 designates a gate electrode disposed on one side of the substrate 1, reference numeral 3 designates an insulating film disposed on the substrate 1 and the gate electrode 2, reference numeral 5 designates a source electrode disposed on the insulating film 3, reference numeral 6 designates a drain electrode also disposed on the insulating film 3 and isolated from the source electrode 5, and reference numeral 4 designates a semiconductor layer comprising a π-conjugated polymer or its LB film and disposed on the insulating film 3, the source electrode 5, and the drain electrode 6, in contact with the source and drain electrodes 5 and 6, respectively, in which the elements 2 to 6 comprise part of the FET 11 in the liquid crystal display apparatus. In addition, reference numeral 7 designates an electrode connected to the drain electrode 6 of the FET 11, reference numeral 8 designates a liquid crystal layer, reference numeral 9 designates a transparent electrode, and reference numeral 10 designates a glass polarizing plate for processing. Orientation is performed on the electrodes 7 and 9. The elements 7 to 10 comprise a part 12 of the liquid crystal display in the liquid crystal display apparatus.

The materials used in FETs and liquid crystal display apparatus in accordance with the present invention are as follows.

The substrate 1 can be formed of any insulating material. More specifically, it can be glass, an alumina sintered body, or an insulating plastic, such as polyamide, polyester, polyethylene, polyphenylene sulfide, or polyparaxylene. In addition, the substrate 1 is preferably transparent when it is used in the liquid crystal display apparatus.

The gate electrode 2, the source electrode 5, and the drain electrode 6 are a metal, such as gold, platinum, chrome, palladium, aluminum, indium, or molybdenum, low-resistance polysilicon, low-resistance amorphous silicon, tin oxide, indium oxide, indium tin oxide (ITO), or the like. However, the materials are not limited to the materials listed above, and two or more of the above materials can be used together. In addition, the electrodes may be made by vacuum deposition, sputtering, plating, or any of several CVD growth methods. In addition, a conductive organic group low molecular compound or π-conjugated polymer can be used. In this case, an LB method can also be used.

In addition, p-type silicon or n-type silicon can be used as the gate electrode 2 and the substrate 1 in the liquid crystal display apparatus in which the FET shown in FIG. 1 or the FET shown in FIG. 2 can be the driving part. In this case, the substrate 1 can be dispensed with. In addition, in this case, although the specific resistivity of the p-type silicon or n-type silicon can be any value, it is preferably less than that of the π-conjugated polymer film 4 serving as the semiconductor layer. In addition, a conductive plate or film, such as a stainless steel plate or a copper plate, can be used as the gate electrode 2 and the substrate 1 in accordance with the use of the FET.

The insulating film 3 can be formed of any organic or inorganic insulating material. In general, silicon oxide ($SiO_2$), silicon nitride, aluminum oxide, polyethylene, polyester, polyamide, polyphenylene sulfide, polyparaxylene, polyacrylonitrile, insulating LB films, or several of these can be used together. There is no limitation on the method for forming the insulating film. For example, CVD, plasma CVD, plasma polymerization, deposition, spin coating, dipping, cluster ion beam deposition, or an LB method can be used. In addition, when p-type silicon or n-type silicon are used as the gate electrode 2 and the substrate 1, a silicon oxide film produced by thermal oxidation of the silicon or the like is preferably used as the insulating film 3.

The electrode 7 of the FET, which is short-circuited to the drain 6 in the liquid crystal display 12 of the liquid crystal display apparatus, can be formed of any material which has sufficient electrical conductivity and is insoluble in the liquid crystal material. For example, a metal, such as gold, platinum, chrome, or aluminum, a transparent electrode, such as tin oxide, indium oxide, indium tin oxide (ITO), or an electrically conductive organic polymer can be used. Of course, two or more of the above materials can be used together. As a material for the electrode 9 on the glass plate 10, a transparent electrode, such as tin oxide or indium tin oxide (ITO), is used in general. Alternatively, a conductive organic polymer having appropriate transparency can be used. In addition, two or more of the above materials can be used together. However, a process for orientation, such as diagonal deposition of $SiO_2$ or rubbing, has to be performed on the electrodes 7 and 9. A liquid crystal material, such as a guest and host type liquid crystal, a TN type liquid crystal, or a smectic C phase liquid crystal, may be used for the liquid crystal layer 8. When glass is used as the substrate 1 and a transparent electrode is used as the electrode 7, the contrast ratio is increased by attaching a polarizing plate to the substrate 1. The polarizing plate can be formed of any polarizing material.

In addition, as a material for the π-conjugated polymer film or the LB film 4 as the semiconductor layer, a material having a precursor of a π-conjugated polymer soluble in a solvent can be used. Of course, two or more of the materials can be used together. In addition, when the LB film of the precursor is formed, a material having an amphipathic property is preferably used. Among the materials having a precursor of the π-conjugated polymer soluble in the solvent are especially the π-conjugated polymers represented by the following general formula (1),

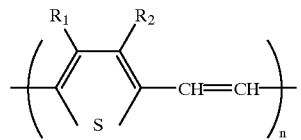

(where $R_1$ and $R_2$ are one of H, an alkyl group, and an alkoxyl group, and n is an integer, at least 10). These materials are excellent with regard to the characteristics of the FET. In addition, since the precursor of the π-conjugated polymer can be easily synthesized, a π-conjugated polymer in which $R_1$ and $R_2$ are —H is preferably used. The solvents can be organic solvents of several kinds, water, or a mixture thereof.

When the precursor LB film is formed, an organic solvent whose specific gravity is less than that of water and which is not likely to dissolve in water and is likely to evaporate is preferably used. A precursor of the π-conjugated polymer in which both $R_{1\ and\ R2}$ are —H in the above general formula (1), a material represented by the following general formula (2),

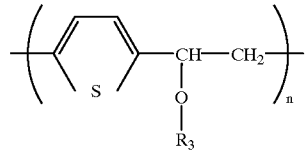

(where $R_3$ is a hydrocarbon group having 1 to 10 carbon atoms) is preferably used because of preservation stability. As the $R_3$ in the general formula (2), any hydrocarbon group having 1 to 10 carbon atoms can be used. For example, methyl, ethyl, propyl, isopropyl, n-butyl, 2-ethylhexyl, or cyclohexyl groups can be used. Among the above, a hydrocarbon group having 1 to 6 carbon atoms, especially a methyl or ethyl group, is preferably used. Although there is not any particular limitation on the method for synthesizing the polymer precursor, the polymer precursor obtained by a sulfonium salt decomposition method which will be described later is preferable because of its stability.

As a monomer, when the general formula (2) is obtained by the sulfonium salt decomposition method, 2, 5-thienylene dialkylsulfonium salt represented by the following general formula (3)

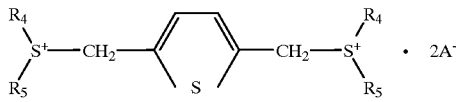

(where $R_4$ and $R_5$ are hydrocarbon groups having 1 to 10 carbon atoms and $A^-$ is a counter ion) is used. As the $R_4$ and $R_5$ in the general formula (3), any hydrocarbon group having 1 to 10 carbon atoms can be used. For example, methyl, ethyl, propyl, isopropyl, n-butyl, 2-ethylhexyl, cyclohexyl, or benzyl groups can be used. Among the above, a hydrocarbon group having 1 to 6 carbon atoms, especially methyl or ethyl groups, are preferably used. There is no particular limitation in the counter ion $A^-$, for example a halogen, a hydroxyl group, boron tetrafluoride, perchloric acid, carboxylic acid, and sulfonic acid ion can be used. Among the above, halogens, such as chlorine or bromine, or hydroxyl group ions are preferably used.

When condensation polymerization of the general formula (3) is performed to produce the general formula (2), water, alcohol alone, or a mixed solvent containing water and/or alcohol is used as a solvent. An alkaline solution is preferably used as a reaction solution in condensation polymerization. The alkaline solution is preferably a strong basic solution of a pH 11 or higher. As an alkali, sodium hydroxide, potassium hydroxide, calcium hydroxide, quaternary ammonium salt hydroxide, sulfonium salt hydroxide, a strong basic ion exchange resin (OH type), or the like is used. Among them, especially, sodium hydroxide, potassium hydroxide or quaternary ammonium salt hydroxide, or strong basic ion exchange resin are preferably used.

Since sulfonium salt is unstable in response to heat and light, especially ultraviolet rays, and is strongly basic, desulfonium-saltation gradually occurs after condensation polymerization with the result that the salt is not effectively changed to an alkoxyl group. Therefore, it is desirable that a condensation polymerization reaction occur at relatively low temperature, more specifically, 25° C. or less, or further −10° C. or less. The reaction time can be determined in accordance with polymerization temperature and is not particularly limited. However, it is usually within a range of 10 minutes to 50 hours.

According to the sulfonium salt decomposition method, after polymerization, the precursor of the π-conjugated polymer is generated as a polymer electrolyte (polymer sulfonium salt) having a high molecular weight and including sulfonium salt, that is

(A⁻) at the side chain and the sulfonium salt side chain reacts with alcohol ($R_3OH$) in the solution and the alkoxyl group (corresponding to $OR_3$ in the formula (2)) of the alcohol becomes the side chain. Therefore, the solvent to be used has to contain an alcohol above $R_3OH$. The alcohol can be used alone or with another solvent. Although any solvent which is soluble in alcohol can be used with alcohol, water is preferably used in practice. Although the ratio of alcohol in the mixed solvent can be any value, alcohol in 5 or more weight percent is preferably used.

The sulfonium side chain can be effectively substituted for the alkoxyl group if a reaction in which the sulfonium side chain is substituted for the alkoxyl group is performed at a temperature higher than the condensation polymerization temperature in a solvent containing alcohol after the condensation polymerization. When the polymerization solvent contains alcohol, substitution for the alkoxyl group can be performed after the polymerization. On the other hand, when the polymerization solvent does not contain alcohol, for example, when it is water, the alcohol is mixed into it after the polymerization and then the same reaction can be performed. The substitution for the alkoxyl group is preferably performed at a temperature of 0° C. to 50° C. and more preferably 0° C. to 25° C. considering reaction speed. Since a polymer having an alkoxyl group at its side chain is insoluble in the mixed solvent in general, it is precipitated as the reaction proceeds. Therefore, the reaction is preferably continued until the polymer is fully precipitated. Thus, the reaction time is preferably 15 minutes or more and, more preferably, 1 hour or more to improve yield. The precursor of the π-conjugated polymer having an alkoxyl group at its side chain is isolated by filtering the precipitate.

In order to obtain a useful precursor of the π-conjugated polymer, with high enough molecular weight and a repeat unit n of at least 10, more preferably 20 to 50,000, of the π-conjugated polymer precursor of the general formula (2), for example, having a molecular weight of 3500 or more which is not dialyzed by dialysis processing, a dialysis film is effectively used.

The precursor of the π-conjugated polymer shown in the general formula (2) having a group such as an alkoxyl group in its side chain has high solubility and is soluble in many kinds of organic solvents. These organic solvents are, for example, dimethylformamide, dimethylactamide, dimethylsulfoxide, dioxane, chloroform, and tetrahydrofuran.

When the LB film of the precursor is formed, an organic solvent having a specific gravity less than that of water and not likely to dissolve in water and likely to evaporate is preferably used.

As a method for producing the precursor of the π-conjugated polymer used in the present invention, spin coating, casting, dipping, bar coating, or roll coating utilizing the precursor of the π-conjugated polymer dissolved in the solvent is used. Thereafter, the solvent evaporates and then a π-conjugated polymer precursor thin film is heated, whereby the π-conjugated polymer semiconductor film is obtained. Although there is not any particular heating condition, when the π-conjugated polymer precursor thin film is heated to become the π-conjugated polymer film, it is preferably heated to 200° C. to 300° C. in an inert gas atmosphere. Of course, the π-conjugated polymer precursor thin film can be changed to the π-conjugated polymer film even if it is heated to 200° C. or less. In addition, when it is heated in an inert gas atmosphere containing an acid such as HCl or HBr, the π-conjugated polymer precursor thin film can be smoothly changed to the π-conjugated polymer film in most cases.

On the other hand, as a method for obtaining an LB film of the π-conjugated polymer precursor used in the present invention, vertical dipping using a Kuhn trough, horizontal attaching, and LB film forming using a moving wall trough, using as a developer a π-conjugated polymer precursor solution dissolved in a solvent with pure water, or an aqueous solution with a salt or the like as a subphase, may be used so that the LB film is deposited on a substrate. Thereafter, water evaporates and then the dried LB film of the π-conjugated polymer precursor is obtained. Then, the LB film of the π-conjugated polymer precursor is heated, whereby the LB film of the π-conjugated polymer serving as a semiconductor is obtained. Although there is not any particular heating condition for heating the LB film of the π-conjugated polymer precursor to become the π-conjugated polymer LB film, it is preferably heated to 200° C. to 300° C. in an inert gas atmosphere. Of course, the LB film of the π-conjugated polymer precursor can be changed to the LB film of the π-conjugated polymer even if it is heated to 200° C. or less. In addition, when it is heated in an inert gas atmosphere containing an acid, such as HCl or HBr, the LB film of the π-conjugated polymer precursor can be smoothly changed to an LB film of the π-conjugated polymer in most cases.

When the LB film of the precursor is formed, even if the precursor of the π-conjugated polymer is soluble in a solvent, if it is not amphipathic enough, a spreading solution mixed with a compound having a good amphipathic property, such as stearic acid or arachidic acid, is used for forming the LB film. Alternatively, the LB film can be formed with the precursor of the π-conjugated polymer adsorbed on a monomolecular film of a compound having an amphipathic property in the subphase.

As described above, according to the method for forming the π-conjugated polymer film, a π-conjugated polymer film or an LB film is not directly formed like a conventional electrochemical polymerization. First, the polymer precursor film or its LB film is formed using a π-conjugated polymer precursor which is soluble in a solvent, and then it is changed to the π-conjugated polymer film or an LB film. As a result, the π-conjugated polymer film or LB film can be uniformly and easily formed on a substrate over a large area.

The π-conjugated polymer has a low electrical conductivity but has semiconductor properties even if undoped. However, doping is often performed to improve characteristics of the FET. There are chemical and physical methods of doping (referring to "Industrial Material", Volume 34, Number 4, page 55, 1986). The former comprises (1) doping from a vapor phase, (2) doping from a liquid phase, (3) electrochemical doping, (4) light induced doping, and the like. The latter method comprises ion implantation. Any of these methods can be used.

Figure 3:
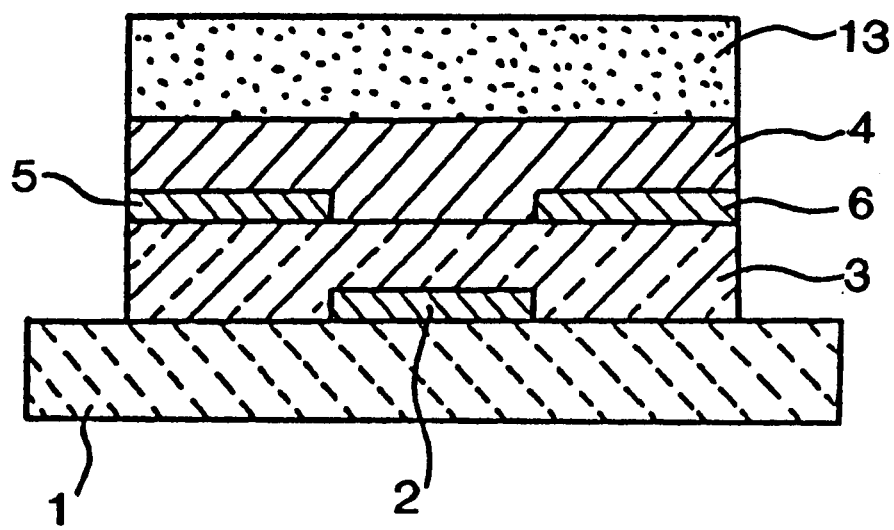
FIGS. 3 and 4 are sectional views, each showing an FET, in accordance with another embodiment of the present invention.
Figure 4:
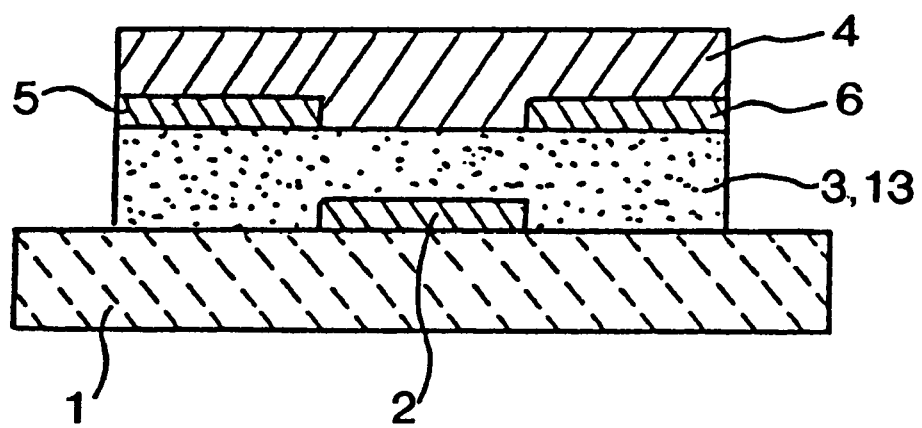

FIGS. 3 and 4 are sectional views each showing an FET in accordance with another embodiment of the present invention. Reference number 13 designates an acid giving film for promoting the reaction from the precursor film of the π-conjugated polymer 4 to the π-conjugated polymer film which is disposed on the π-conjugated polymer film 4 in FIG. 3 but is disposed on the substrate 1 and the gate electrode 2 in FIG. 4. In FIG. 3, even if the positions of the π-conjugated polymer film 4 and the acid giving film 13 are exchanged, more specifically, even if the acid giving film 13 is formed on an insulating film 3, the source electrode 5, and the drain electrode 6 and then the π-conjugated polymer film is formed on the acid giving film 13, the completed FET can control the current flow between the source and drain in response to a gate voltage.

Figure 5:
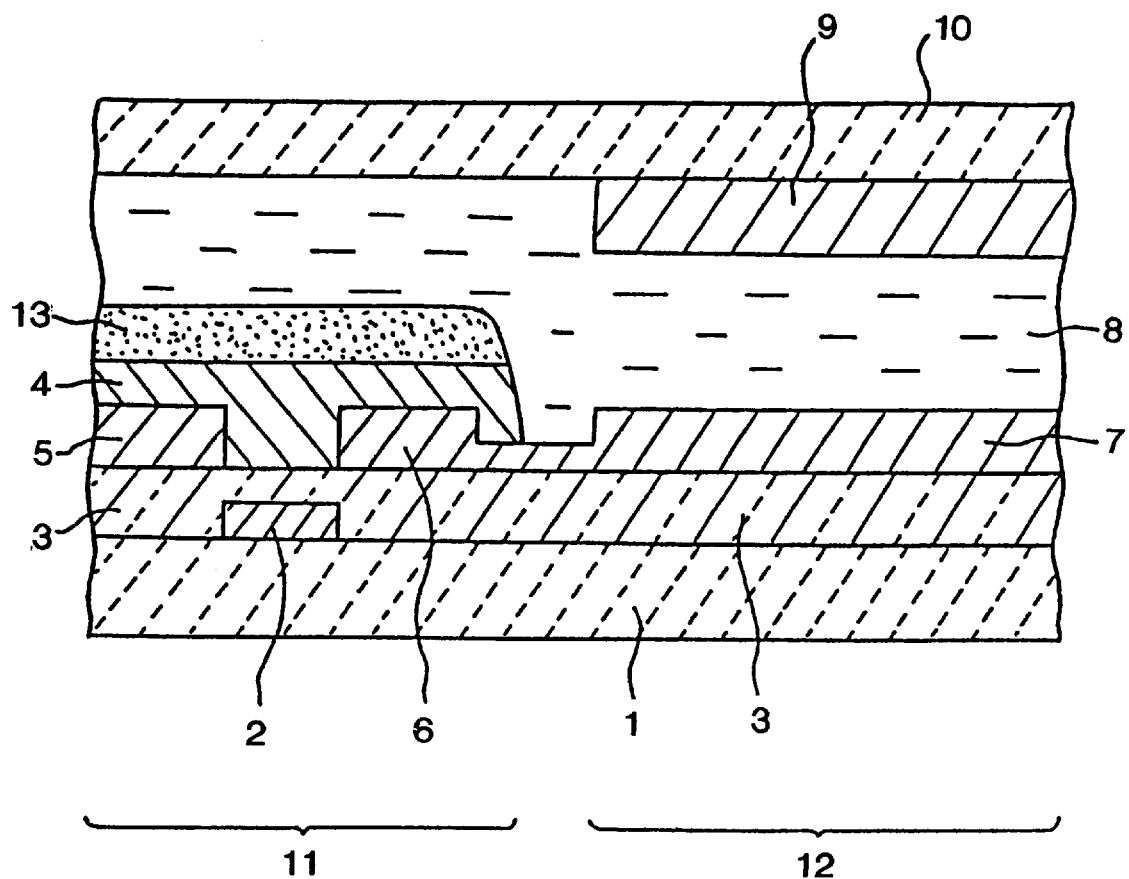
FIG. 5 is a sectional view of one pixel of a liquid crystal display apparatus in accordance with another embodiment of the present invention.

FIG. 5 is a sectional view showing a liquid crystal display apparatus in accordance with another embodiment of the present invention in which reference numeral 13 designates an acid giving film for promoting the reaction from a precursor film of a π-conjugated polymer to a π-conjugated polymer which is disposed on the π-conjugated polymer film 4.

Other parts in FIGS. 3, 4, and 5 designate the same parts as in FIGS. 1 and 2, and the methods for manufacturing them are also the same as already described.

The acid giving layer 13 is a film which produces an acid to promote the reaction from the precursor of the π-conjugated polymer to the π-conjugated polymer 4 and does not have any particular limitation. The acid giving film itself is preferably an insulator. For example, the following films are used: an acid impregnated polymer incorporating polyimide, a polyester, a polyethylene, a polyphenylene sulfide, a polyparaxylene, or the like, the above polymers containing an acid generating agent such as a Lewis acid amine complex, tertiary amine class, a Lewis acid diazonium salt, a Lewis acid diallyliodonium salt, or a Lewis acid sulfonium salt, or a film which easily eliminates acid by a reaction of p-xylylene-bis (sulfonium halogenide), its derivative, or the like. There is no particular limitation on the method of producing the acid giving film. For example, CVD, plasma CVD, plasma polymerization, deposition, cluster ion beam deposition, organic molecular beam epitaxial growth, spin coating, dipping, or an LB method can be all used.

As an example, a description will be given of a case where the π-conjugated polymer represented by the general formula (1) is used as the semiconductor layer and a π-conjugated polymer represented by the following general formula (4)

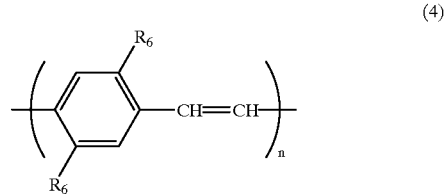

(4)

(where $R_6$ is one of —H, alkyl group, alkoxyl group and n is an integer, at least 10) is used as the acid giving film. The general formula (4) has a π-conjugated polymer precursor represented by the following general formula (5)

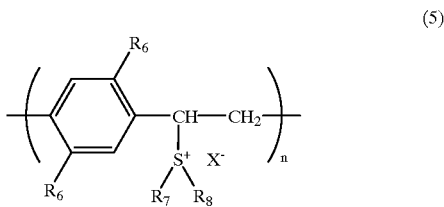

(5)

(where $R_6$ is one of —H, alkyl group, alkoxyl group, $R_7$ and $R_8$ are hydrocarbon groups having 1 to 10 carbon atoms, $X^-$ is a halogen, such as Br or Cl, and n is an integer, at least 10). The general formula (5) is soluble in water, and a film can be easily formed by spin coating, casting, dipping, bar coating, roll coating, or the like. Therefore, as a method for forming laminated films comprising the π-conjugated polymer precursor thin film (the general formula (2)) as the semiconductor layer and the π-conjugated polymer precursor film (the general formula (5)) as the acid giving film, although there is no particular limitation, it is preferable that the laminated films are formed by producing the π-conjugated polymer precursor film (the general formula (2)) as the semiconductor film by spin coating, casting, dipping, bar coating, roll coating, or the like using a solution of the π-conjugated polymer precursor dissolved in a solvent, evaporating the solvent, and then forming the acid giving film (the general formula (5)) by the same method as above. Alternatively, the laminated films may be formed by forming the acid giving film (the general formula (5)) as described above and then forming the π-conjugated polymer precursor film (the general formula (2)) as the semiconductor film by spin coating, casting, dipping, bar coating, roll coating, or the like using a solution of the π-conjugated polymer precursor dissolved in a solvent. Of course, the laminated layers can be repetitively formed. Thereafter, the thus formed laminated films are heated, whereby laminated layers of the π-conjugated polymer film (the general formula (1)) as the semiconductor film and the insulating film (the general formula (4)) are formed. There is no restriction on heating when the laminated films comprising the π-conjugated polymer film (the general formula (1)) and the insulating film (the general formula (4)) are formed by heating the laminated films comprising the π-conjugated polymer precursor thin film (the general formula (2)) and the acid giving film (the general formula (5)). However, they are preferably heated to a temperature of 100° C. to 300° C. in an inert gas atmosphere.

A description will be given of a method when the π-conjugated precursor film (the general formula (5)) is used as the acid giving film. The π-conjugated polymer precursor film (the general formula (5)) as the acid giving layer is changed to the π-conjugated polymer (the general formula (4)) by heating. At this time, sulfonium

and acid (HX) are left. The remaining acid is diffused into the π-conjugated polymer precursor film (the general formula (2)) as the semiconductor layer, supplying acid.

In addition, if the acid giving film is an insulator, the acid giving film can also serve as the gate insulating film in the FET (FIG. 4). In this case, the process for manufacturing the FET is simplified.

Next, a description will be given of an operating mechanism of the thus formed FET and a liquid crystal display apparatus in which the FET is a drive element by describing a liquid crystal display apparatus.

Although the operating mechanism is still unknown in many respects, it is believed that the width of a depletion layer formed at a surface of the π-conjugated polymer film 4 or its LB film is controlled by a voltage applied between the gate electrode 2 and the source electrode 5 at the interface between the π-conjugated polymer film or its LB film 4 and the insulating film 3. As a result, an effective channel cross-sectional area varies so that the current flowing between the source electrode 5 and the drain electrode 6 varies. When the π-conjugated polymer film 4 or its LB film has the properties of a p-type semiconductor having low electrical conductivity, even if p-type silicon, n-type silicon, or an organic electrically conductive polymer which has high electrical conductivity is used as the gate electrode 2 instead of a metal electrode, it is believed that a depletion layer having a large width is formed in the π-conjugated polymer film 4 or its LB film, whereby an electrical field effect occurs.

In a liquid crystal display apparatus in accordance with the present invention, the FET 11 is connected in series to the liquid crystal display 12. When the π-conjugated polymer film or its LB film has the properties of a p-type semiconductor and a negative voltage is applied to the gate electrode 2 while a negative voltage is applied to the transparent electrode 9 using the source electrode 5 as a reference, the liquid crystal material 8 is turned on. It is believed that the resistance between the source and drain electrodes of the FET is decreased by applying the negative voltage to the gate electrode 2 while a voltage is applied to the liquid crystal display 12. When no gate voltage is applied and a negative voltage is applied to the transparent electrode 9 using the source electrode 5 as a reference, the liquid crystal material 8 is not turned on. It is believed that the resistance between the source and drain electrodes of the FET is increased so that no voltage is applied to the liquid crystal display 12. As described above, in a liquid crystal display apparatus in accordance with the present invention, operation of the liquid crystal display 12 can be controlled by varying the gate voltage applied to the attached FET.

Although the gate electrode 2 is disposed on the substrate 1 in FIG. 2, the π-conjugated polymer film or its LB film are disposed on the substrate, the source electrode and the drain electrode are separately formed thereon, and the insulating film is interposed between the source and drain electrodes, and the gate electrode is formed on the insulating film. Alternatively, the gate electrode may be formed on the substrate, the insulating film interposed between them, the π-conjugated polymer film or the LB formed thereon, and then the source electrode and the drain electrode are separately formed thereon. In another alternative, the source electrode and the drain electrode are separately formed on the substrate, the π-conjugated polymer film of the LB film is formed thereon, the insulating film is interposed between them, and then the gate electrode is formed.

Although the acid giving film 13 is formed on the π-conjugated polymer film 4 as the semiconductor layer in FIG. 3, the gate electrode 2 may be disposed on the substrate 1, the insulating film 3 interposed between them, the source electrode 5 and the drain electrode 6 formed thereon, the acid giving film 13 formed thereon, and the π-conjugated polymer film 4 as the semiconductor layer formed thereon. Alternatively, as shown in FIG. 4, the gate electrode 2 may be disposed on the substrate 1, the acid giving layer 13 formed thereon, the source electrode 5 and the drain electrode 6 formed thereon, and then the π-conjugated polymer film 4 as the semiconductor layer is formed thereon in which the acid giving film 13 is also the gate insulating film 3. In still another alternative, the gate electrode 2 is disposed on the substrate 1, the acid giving layer 13 as the insulating film 3 is formed thereon, the π-conjugated polymer film 4 as the semiconductor layer is formed thereon, and then the source electrode 5 and the drain electrode 6 are formed thereon.

In yet a further alternative, the gate electrode 2 is disposed on the substrate 1, the insulating film 3 is interposed between them, the π-conjugated polymer film 4 is formed thereon, the acid giving film 13 is formed thereon, and then the source electrode 5 and the drain electrode 6 are formed thereon. The source electrode 5 and the drain electrode 6 may be disposed on the substrate 1, the π-conjugated polymer film 4 formed thereon, the insulating film 3 as the acid giving film 13 is interposed between them, and then the gate electrode 2 is formed thereon.

Although the FET 11 and the liquid crystal display 12 are disposed on the same substrate in FIGS. 2 and 5, they can be formed on different substrates and then connected.

Although specific embodiments of the present invention will be described hereinafter, the present invention is not limited to them.

Embodiment 1

A 3-inch n-type silicon substrate having a resistivity of 4 to 8 Ωcm was heated in an oxygen flow and then covered with a silicon oxide film having a thickness of 3000 Å. Then five pairs of gold electrodes with a thickness of 300 Å each having an under layer of chrome with a thickness of 200 Å were deposited on one side of the silicon oxide film in a conventional vacuum deposition process, photolithography process, or etching. The five pairs of gold electrodes served as source and drain electrodes in an FET. The width of the pair of gold electrodes, that is, the channel width, was 2 mm and the distance between them, that is, the channel length, was 16 microns. The thus formed substrate will be referred to as an FET substrate hereinafter.

The temperature of the FET substrate and of its ambient were approximately 60° C. and a precursor film was formed on the FET substrate by spin coating using a dimethylformamide (DMF) solution with approximately 2 wt % of a poly (2,5-thienylene vinylene) precursor having the following chemical structure:

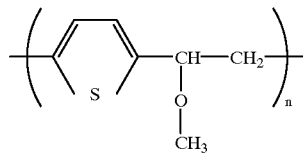

The rotational speed of the spinner was 2000/min. The thickness of the precursor film was approximately 800 Å.

Then, the FET substrate covered with a poly (2,5-thienylene vinylene) precursor film was heated to 270° C. for two hours in a nitrogen flow in an infrared image furnace. As a result, the color of the precursor film changed from light yellow to brown. The poly (2,5-thienylene vinylene) precursor film changed to the poly (2,5-thienylene vinylene) film through the heating treatment and accordingly absorption in accordance with

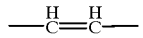

at 1590 cm$^{-1}$ occurred in an infrared absorption spectrum.

Then, the silicon oxide film on the other surface of the FET substrate was removed and an alloy of gallium and indium was attached to the uncovered silicon surface, whereby ohmic contact was made.

The silicon substrate itself served as a common gate electrode of the five FETs, and the silicon oxide film on the silicon substrate served as a common gate insulating film of the five FETs. Thus, the FET shown in FIG. 1 was produced. In addition, reference numerals 1 and 2 designate the silicon substrate and the gate electrode, reference numeral 3 designates the silicon oxide insulating film, reference numeral 4 designates the poly (2,5-thienylene vinylene) film obtained from the poly (2,5-thienylene vinylene) precursor film as the semiconductor film, and reference numerals 5 and 6 designate gold source and drain electrodes, respectively.

Embodiment 2

The FET substrate made in accordance with embodiment 1 was used. A temperature of a subphase (water) was 20° C., and an LB film of a precursor was formed on the FET substrate by dipping using a Kuhn trough containing 0.5 ml of a dimethylformamide (DMF) solution with approximately 2 wt % of a poly (2,5-thienylene vinylene) precursor having the following chemical structure

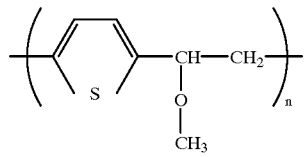

and 9.5 ml of chloroform as a spreading solution. At this time, the surface tension τ was set at 20 mN/m. The number of layers of the precursor LB film was 100.

Then, the FET substrate covered with the LB film of the poly (2,5-thienylene vinylene) precursor was heated at 210° C. for two hours in a nitrogen flow in an infrared image furnace. As a result, the color of the precursor LB film changed from light yellow to brown. The LB film of the poly (2,5-thienylene vinylene) precursor changed to an LB film of poly (2,5-thienylene vinylene) through the above heating treatment and accordingly absorption in accordance with

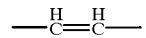

at 1590 cm$^{-1}$ occurred in the infrared absorption spectrum.

The silicon oxide film on the other surface of the FET substrate was removed and an alloy of gallium and indium was applied to the uncovered silicon surface, whereby ohmic contact was made.

The silicon substrate itself served as a common gate electrode of the five FETs and the silicon oxide film on the silicon substrate served as a common gate insulating film of the five FETs. Thus, the FET shown in FIG. 1 was produced. In addition, reference numerals 1 and 2 designate the silicon substrate and also the gate electrode, reference numeral 3 designates the silicon oxide insulating film, reference numeral 4 designates the LB film of poly (2,5-thienylene vinylene) obtained from the LB film of the poly (2,5-thienylene vinylene) precursor serving as the semiconductor film, and reference numerals 5 and 6 designate gold source and drain electrodes, respectively.

Embodiment 3

Another example using a heat treatment different from that of embodiment 2 to provide the structure of the FET shown in FIG. 1 is described hereinafter.

Similar to embodiment 2, an LB film (100 layers) of poly (2,5-thienylene vinylene) was formed on the FET substrate by the LB method. However, in this embodiment, a platinum electrode 300 Å thick having an under layer formed of chrome 200 Å thick was used instead of the gold electrode on the FET substrate.

Then, the FET substrate covered with the LB film of a poly (2,5-thienylene vinylene) precursor was heated to 90° C. for one hour and a half in a nitrogen flow containing hydrogen chloride gas in an infrared image furnace. As a result, the color of the precursor LB film changed from light yellow to dark purple, inclining toward a metallic luster. The LB film of the poly (2,5-thienylene vinylene) precursor completely changed to an LB film of poly (2,5-thienylene vinylene) through the above heating treatment and accordingly absorption in accordance with

at 1590 cm$^{-1}$ appeared, in and absorption in accordance with

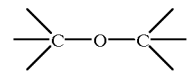

at 1099 cm$^{-1}$ disappeared from, the infrared absorption spectrum.

Similar to embodiment 2, the silicon substrate itself served as a common gate electrode of the five FETs and the silicon oxide film served as a common gate insulating film of the five FETs. Thus, the FET of the structure shown in FIG. 1 was produced. In addition, reference numerals 1 and 2 designate the silicon substrate and the gate electrode, reference numeral 3 designates the silicon oxide insulating film, reference numeral 4 designates the LB film of poly (2,5-thienylene vinylene) obtained from the LB film of poly (2,5-thienylene vinylene) precursor as the semiconductor film, and reference numerals 5 and 6 designate platinum source and drain electrodes, respectively.

Embodiment 4

The temperature of the same FET substrate as used in embodiment 1 and its ambient temperature was approximately 60° C. and a precursor film was formed on the FET substrate by spin casting using a dimethylformamide (DMF) solution with approximately 2 wt % of a poly (2,5-thienylene vinylene) precursor having the following chemical structure

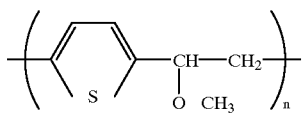

The rotational speed of the spinner was 2000/min. The precursor film was approximately 800 Å thick. The solvent was evaporated to some degree and the temperature of the FET substrate and its ambient was approximately 60° C. and a poly (p-phenylene vinylene) precursor film was formed on the poly (2,5-thienylene vinylene) precursor by spin casting using an aqueous solution with approximately 2 wt % of the poly (p-phenylene vinylene) precursor having the following chemical structure

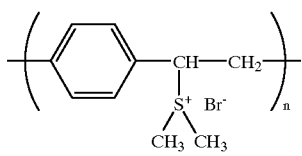

The rotational speed of the spinner was 2000/min. and the thickness of the obtained precursor film was 700 Å.

The FET substrate covered with two-layer films of the poly (2,5-thienylene vinylene) precursor film and the poly (p-phenylene vinylene) precursor film was heated to 210° C. for two hours in a nitrogen flow in an infrared image furnace. As a result, the color of the film changed from light yellow to dark brown or dark purple. The laminated films comprising the poly (2,5-thienylene vinylene) precursor film and the poly (p-phenylene vinylene) precursor film were changed to laminated films comprising a poly (2,5-thienylene vinylene) film and poly (p-phenylene vinylene) through the above heating treatment and accordingly absorption in accordance with C=C of poly (2,5-thienylene vinylene) at 1590 $cm^{-1}$ and absorption in accordance with C=C of poly (p-phenylene vinylene) at 970 $cm^{-1}$, respectively, appeared in the infrared absorption spectrum. Meanwhile, no corrosion or the like caused by acid occurred in the element formed of poly (2,5-thienylene vinylene) during the heat treatment.

The silicon oxide film on the other surface of the FET substrate was removed and an alloy of gallium and indium was applied to the uncovered silicon surface, whereby ohmic contact was made.

The silicon substrate served as a common gate electrode of the five FETs and the silicon oxide film served as a common gate insulating film of the five FETs. Thus, the FET shown in FIG. 3 was produced. In addition, reference numerals 1 and 2 designate the silicon substrate and the gate electrode, reference numeral 3 designates the silicon oxide insulating film, reference numeral 4 designates the poly (2,5-thienylene vinylene) film obtained from the poly (2,5-thienylene vinylene) precursor film as the semiconductor film, reference numerals 5 and 6 designate gold source and drain electrodes, respectively, and reference numeral 13 designates the poly (p-phenylene vinylene) film obtained from the poly (p-phenylene vinylene) precursor film as the acid giving film.

Embodiment 5

An example of a method for manufacturing a liquid crystal display apparatus having the structure shown in FIG. 2 will be described hereinafter. An n-type silicon substrate (25 mm×40 mm) having a resistivity of 4 to 8 Ωcm and a thickness of 300 microns was thermally oxidized, whereby oxide films ($SiO_2$ films) having a thickness of approximately 900 Å were formed on both surfaces. Similar to embodiment 1, the gold electrodes (under layer chrome 200 Å and gold 300 Å) serving as the source electrode 5, the drain electrode 6, and an electrode 7, shown in FIG. 2, were formed on that surface. In addition, both the source electrode 5 and the drain electrode 6 had an effective area of 2 mm×4 mm, and they were separated by a width of 3 microns. More specifically, the channel width was 2 mm, and the channel length was 3 microns in the FET. In addition, the electrode 7 had an effective area of 17×19 $mm^2$. This substrate is referred to as a liquid crystal display apparatus substrate hereinafter. Similar to embodiment 1, a poly (2,5-thienylene vinylene) precursor film was formed on the liquid crystal apparatus substrate using a DMF solution with approximately 2 wt % of the poly (2,5-thienylene vinylene) precursor.

The poly (2,5-thienylene vinylene) precursor film, other than the FET part of the liquid crystal display apparatus substrate, was washed using chloroform. Thereafter, this substrate was heated to 200° C. for approximately one hour in a nitrogen flow containing approximately 1% of hydrogen chloride gas in an infrared image furnace. Thus, only the FET part was covered with the poly (2,5-thienylene vinylene) film and the FET part 11 in the liquid crystal display apparatus shown in FIG. 2 was completed.

Orientation processing was performed by obliquely depositing $SiO_2$ on the liquid crystal apparatus substrate and an oppositely arranged glass plate 10 having an ITO electrode 9 formed thereon so that orientation of the liquid crystal material occurred. A polyester film with a thickness of 10 microns was interposed between the liquid crystal display substrate and the oppositely arranged glass plate 10 having the ITO electrode 9, except for one part so that the liquid crystal display part is invisible. The neighborhood of the liquid crystal display part was sealed with an epoxy resin, also except for one part. A guest and host liquid crystal material (made by Merck Company with the trade name ZLI1841) was injected through this unsealed part, and then that part was sealed with the epoxy resin. A polarizing plate was adhered to the glass plate 10 and the liquid crystal display part 12 in the liquid crystal display apparatus was completed.

Finally, the $SiO_2$ on the back surface of the liquid crystal display apparatus substrate was partially removed, and an alloy of gallium and indium was applied thereto, whereby an ohmic contact was made. Then, a lead wire was attached thereto with silver paste so that the liquid crystal display apparatus was completed.

Embodiment 6

Similar to embodiment 1, an LB film (100 layers) of a poly (2,5-thienylene vinylene) precursor was formed on the liquid crystal display apparatus substrate using a solution mixed with 0.5 ml of the DMF solution with approximately 2 wt % of the poly (2,5-thienylene vinylene) precursor and 9.5 ml of chloroform as a developer.

Then, the LB film of the poly (2,5-thienylene vinylene) precursor other than the FET part of the liquid crystal display apparatus substrate was washed using chloroform. This substrate was heated to 90° C. for approximately one hour and a half in a nitrogen flow containing approximately 1% of hydrogen chloride gas in an infrared image furnace. Thus, only the FET part was covered with the LB film of poly (2,5-thienylene vinylene) and the FET part 11 in the liquid crystal display apparatus shown in FIG. 2 was completed.

Orientation processing was performed by obliquely depositing $SiO_2$ on the liquid crystal apparatus substrate and an oppositely arranged glass plate 10 having an ITO electrode 9 so that orientation of a liquid crystal occurred. Then, a polyester film with a thickness of 10 microns was interposed between the liquid crystal display apparatus substrate and the oppositely arranged glass plate 10 having the ITO electrode 9, except for one part so that the liquid crystal display part was visible. The neighborhood of the liquid crystal display part was sealed with an epoxy resin, also except for one part. The guest and host liquid crystal material (made by Merck Company with the trade name ZLI1841) was injected through this unsealed part, and then that part was sealed with the epoxy resin. A polarizing plate was adhered to the glass plate 10, and the liquid crystal display part 12 in the liquid crystal display apparatus was completed.

Finally, the $SiO_2$ on the back surface of the liquid crystal display apparatus substrate was partially removed and an alloy of gallium and indium was applied thereto, whereby an ohmic contact was made. A lead wire was attached thereto with silver paste, so that the liquid crystal display apparatus was completed.

Embodiment 7

An example of a method for manufacturing a liquid crystal display apparatus having the structure shown in FIG. 5 will be shown hereinafter. Similar to embodiment 4, a poly (2,5-thienylene vinylene) precursor film was formed on the liquid crystal apparatus substrate using a DMF solution with approximately 2 wt % of the poly (2,5-thienylene vinylene) precursor. Then, similar to embodiment 4, a poly (p-phenylene vinylene) precursor film was formed on the poly (2,5-thienylene vinylene) precursor film using an aqueous solution with approximately 2 wt % of the poly (p-phenylene vinylene) precursor. The poly (2,5-thienylene vinylene) precursor and the poly (p-phenylene vinylene) precursor film, other than the FET part of the liquid crystal display apparatus substrate, was washed using chloroform. Thereafter, this substrate was heated to 200° C. for approximately one hour in a nitrogen flow in an infrared image furnace. Thus, only the FET part was covered with poly (2,5-thienylene vinylene) and poly (p-phenylene vinylene), and the FET part 11 in the liquid crystal display apparatus shown in FIG. 5 was completed. Then, the liquid crystal display part 12 in the liquid crystal display apparatus was completed by the same steps described for embodiment 5. Then, similar to embodiment 5, the liquid crystal display apparatus was completed.

Comparative Example

An element as a comparative example was manufactured in accordance with Applied Physics Letters, Volume 49, page 1210, 1986. More specifically, a reaction solution was made by dissolving 0.15 g of 2, 2'-dithiophene as a monomer and 0.55 g of tetraethylammonium perchlorate as an electrolyte in 75 ml of acetonitrile. This solution was aerated with nitrogen gas of high impurity. The FET substrate obtained in embodiment 1 was dipped therein. Then, electrochemical polymerization was performed by applying a constant current (100 $\mu A/cm^2$) between opposite platinum electrodes (10 mm×20 mm) for 480 seconds using five pairs of gold electrodes on the FET substrate as working electrodes, whereby a polythiophene film with a thickness of 1400 Å was formed on the five pairs of gold electrodes and the silicon oxide film. Since a large amount of perchlorate ions were doped into the polythiophene film at the time of the electrochemical polymerization, the potential of the five pairs of gold electrodes was set at 0 V with reference to a saturated calomel electrode, and dedoping was performed immediately after the electrochemical polymerization so that the polythiophene had the electrical conductivity of a semiconductor layer. The FET was washed with acetonitrile two times and then dried in a vacuum desiccator.

Next, the characteristics of the devices obtained in accordance with embodiments 1 to 7 and the comparative example will be described.

Figure 6:
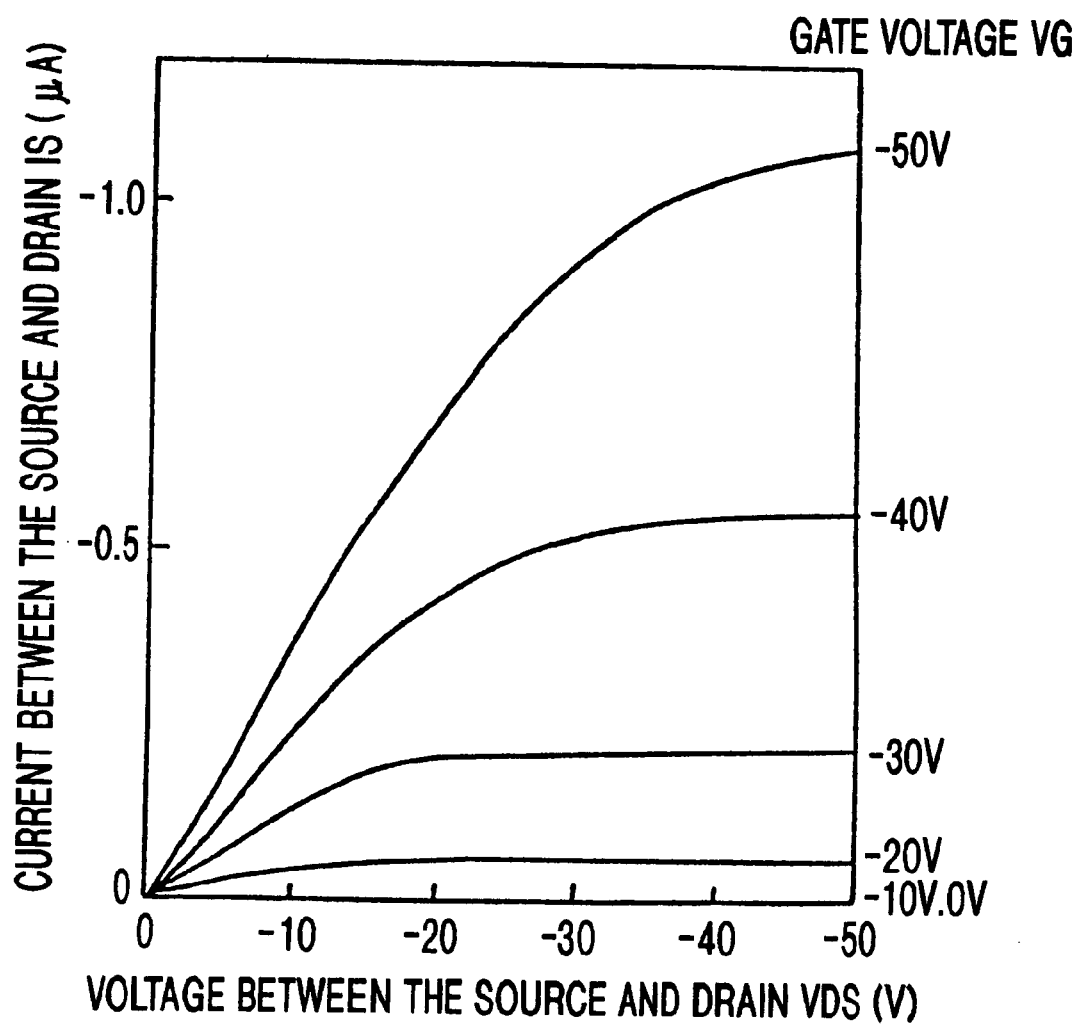
FIG. 6 is a graph showing current flow between a source and a drain as a function of the voltage between the source and drain, with gate voltage as a parameter, of an FET according to a first embodiment of the invention.

FIG. 6 shows electrical characteristics of one of five FETs in accordance with embodiment 1. Referring to this figure, the abscissa shows the voltage ($V_{DS}$) between the source and drain and the ordinate shows the current ($I_S$) between the source and drain. When the gate voltage ($V_G$) is at 0 V, there is almost no $I_S$ even if $V_{DS}$ is increased. In addition, $I_S$ is saturated when $V_{DS}$ is large so that the typical electrical characteristics of an enhancement type field effect transistor are obtained. As can be seen from this figure, the current between the source and drain has a large variation with applied gate voltage. Although FIG. 6 shows the characteristics of one of the five FETs, the other FETs have the same characteristics as shown in FIG. 6. In addition, when their electrical characteristics are measured after these FETs have been left in air for approximately one month, it was found that the characteristics hardly changed and that the FETs produced in accordance with this embodiment have high stability.

Figure 7:
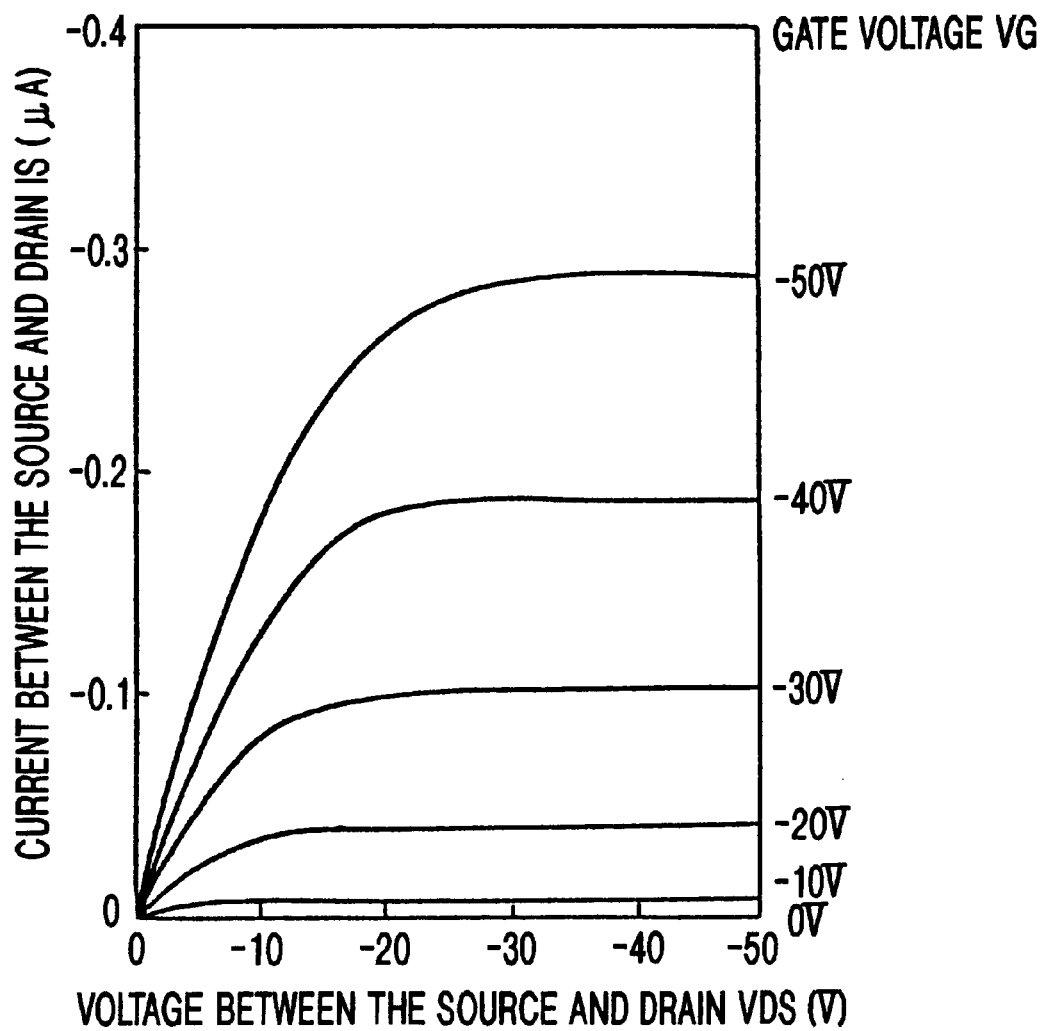
FIGS. 7, 8, and 9 are graphs showing the same characteristics as FIG. 6 for second, third, and fourth embodiments, respectively.
Figure 8:
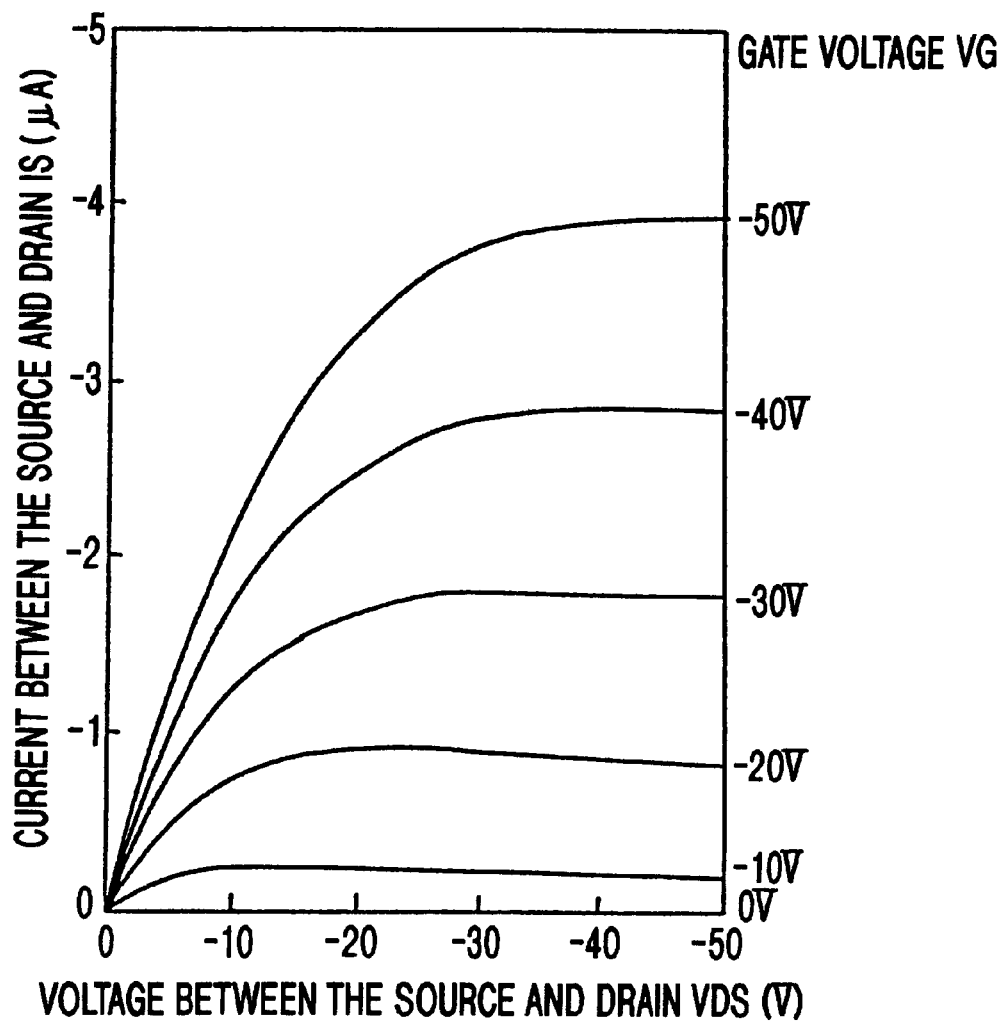

Next, FIGS. 7 and 8 show electrical characteristics of one of five FETs produced in accordance with embodiment 2 and electrical characteristics of one of five FETs produced in accordance with embodiment 3, respectively. Referring to these figures, the abscissa shows the voltage ($V_{DS}$) between the source and drain and the ordinate shows the current ($I_S$) between the source and drain. When the gate voltage ($V_G$) is at 0 V, there is almost no $I_S$ even if $V_{DS}$ is increased. However, when a negative $V_G$ is applied, $I_S$ is increased. In addition, $I_S$ is saturated when $V_{DS}$ is large so that the typical electrical characteristics of an enhancement type field effect transistor are obtained. As can be seen from these figures, the current between the source and drain can significantly vary with an applied gate voltage. Although FIGS. 7 and 8 each show the characteristics of one of the five FETs in accordance with each embodiment, the other FETs show the same characteristics as that shown in FIGS. 7 and 8. In addition, when their electrical characteristics are measured after these FETs are left in air for approximately one month, it is found that their characteristics are hardly changed and the FETs produced in accordance with these embodiments have high stability.

Figure 9:
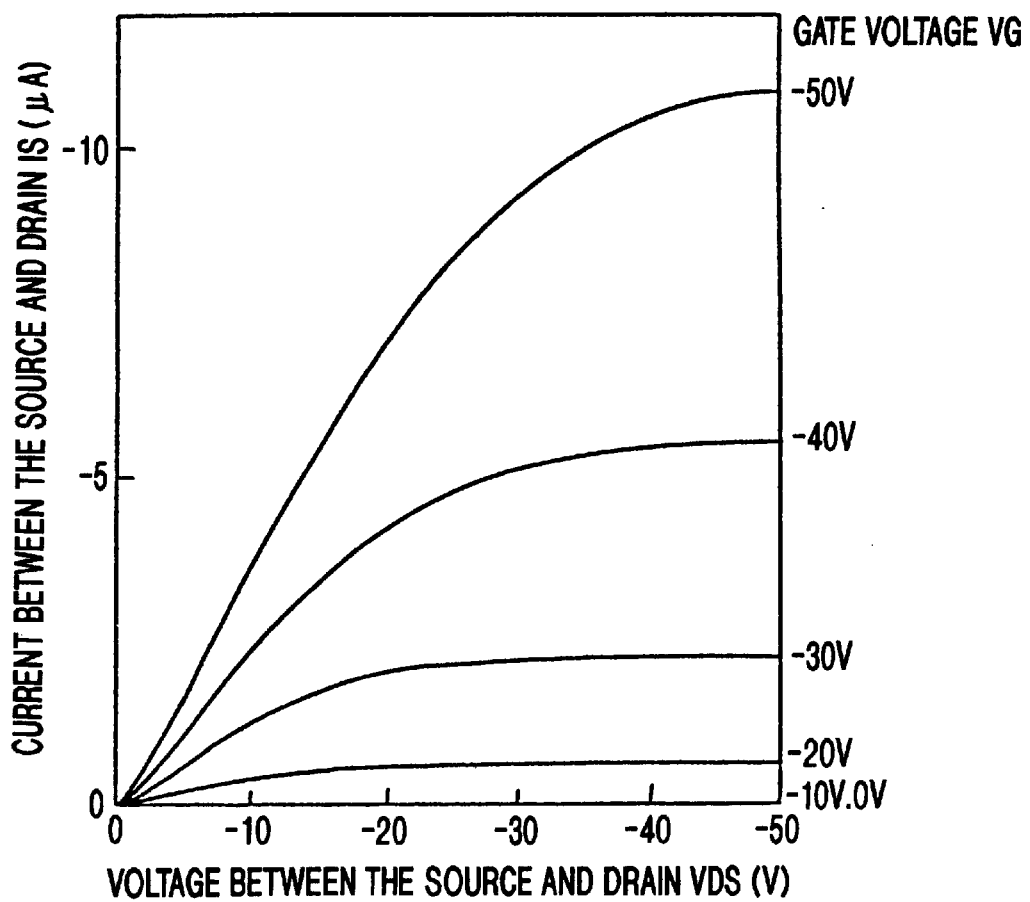

FIG. 9 shows electrical characteristics of one of five FETs produced in accordance with embodiment 4. Referring to this figure, the abscissa shows the voltage ($V_{DS}$) between the source and drain and the ordinate shows the current ($I_S$) between the source and drain. Similar to embodiment 1, typical electrical characteristics of an enhancement type field effect transistor are also obtained in this case. As can be seen from this figure, a large variation in the current between the source and drain can be produced with an applied gate voltage as compared with embodiment 1 shown in FIG. 6.

Figure 10:
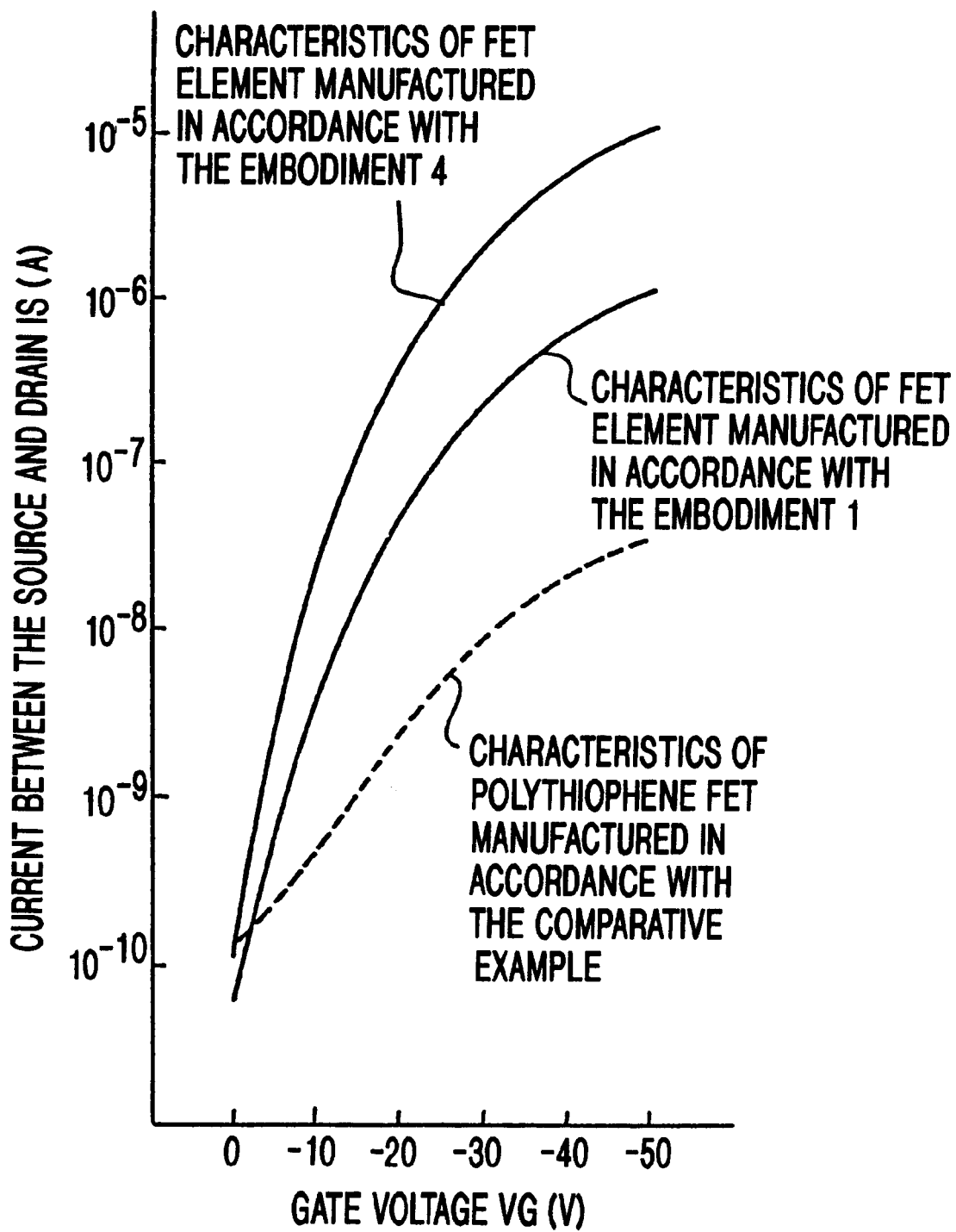
FIG. 10 is a graph showing current flow between the source and drain as a function of gate voltage of an FET according to first and fourth embodiments of the invention and a comparative FET where the voltage between the source and drain is −50 V.

FIG. 10 shows characteristics of the current flow between the source and drain as a function of gate voltage for one of the five FETs manufactured in accordance with each of embodiments 1 and 4 and an FET manufactured in accordance with the comparative example with a constant voltage between the source and drain of −50 V. Referring to this figure, the abscissa shows the gate voltage ($V_G$) and the ordinate shows the current ($I_S$) between the source and drain. As can be seen from FIG. 10, the current between the source and drain is modulated by the gate voltage over four orders of magnitude in the FET manufactured in accordance with embodiment 1. In addition, the modulatable current between the source and drain is five orders of magnitude or more in the FET manufactured in accordance with embodiment 4. Meanwhile, the current between the source and drain that can be modulated by the gate voltage is only two and a half orders of magnitude in the conventional FET of the comparative example. Thus, the characteristics of FETs in accordance with embodiments 1 and 4 are highly improved as compared with the conventional FET.

Figure 11:
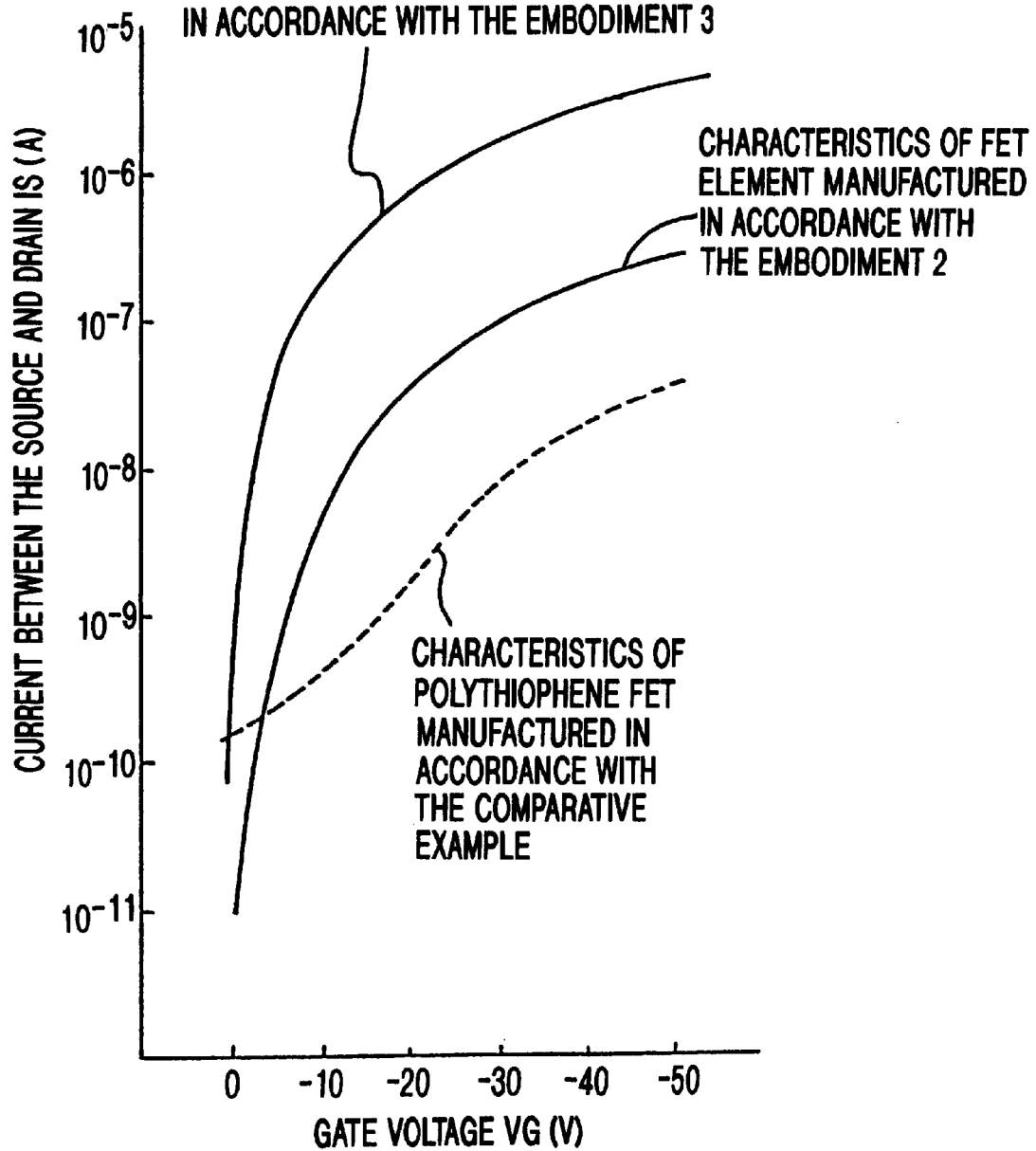
FIG. 11 is a graph showing characteristics of second and third FET embodiments according to the invention and of a comparative FET.

FIG. 11 shows characteristics of the current between the source and drain as a function of the gate voltage of one of the five FETs manufactured in accordance with embodiment 2, one of the five FETs manufactured in accordance with embodiment 3 and the FET manufactured in accordance with the comparative example with a constant voltage between the source and drain of 50 V. Referring to this figure, the abscissa shows the gate voltage ($V_G$) and the ordinate shows the current ($I_S$) between the source and drain. As can be seen from FIG. 11, the current between the source and drain is modulated by the gate voltage over four orders of magnitude or more in the FETs manufactured in accordance with embodiments 2 and 3. Meanwhile, the current between the source and drain is modulated by the gate voltage over only two and a half orders of magnitude in the conventional FET in accordance with the comparative example. Thus, the characteristics of the FETs in accordance with embodiments 2 and 3 are highly improved as compared with the conventional FET.

Figure 12:
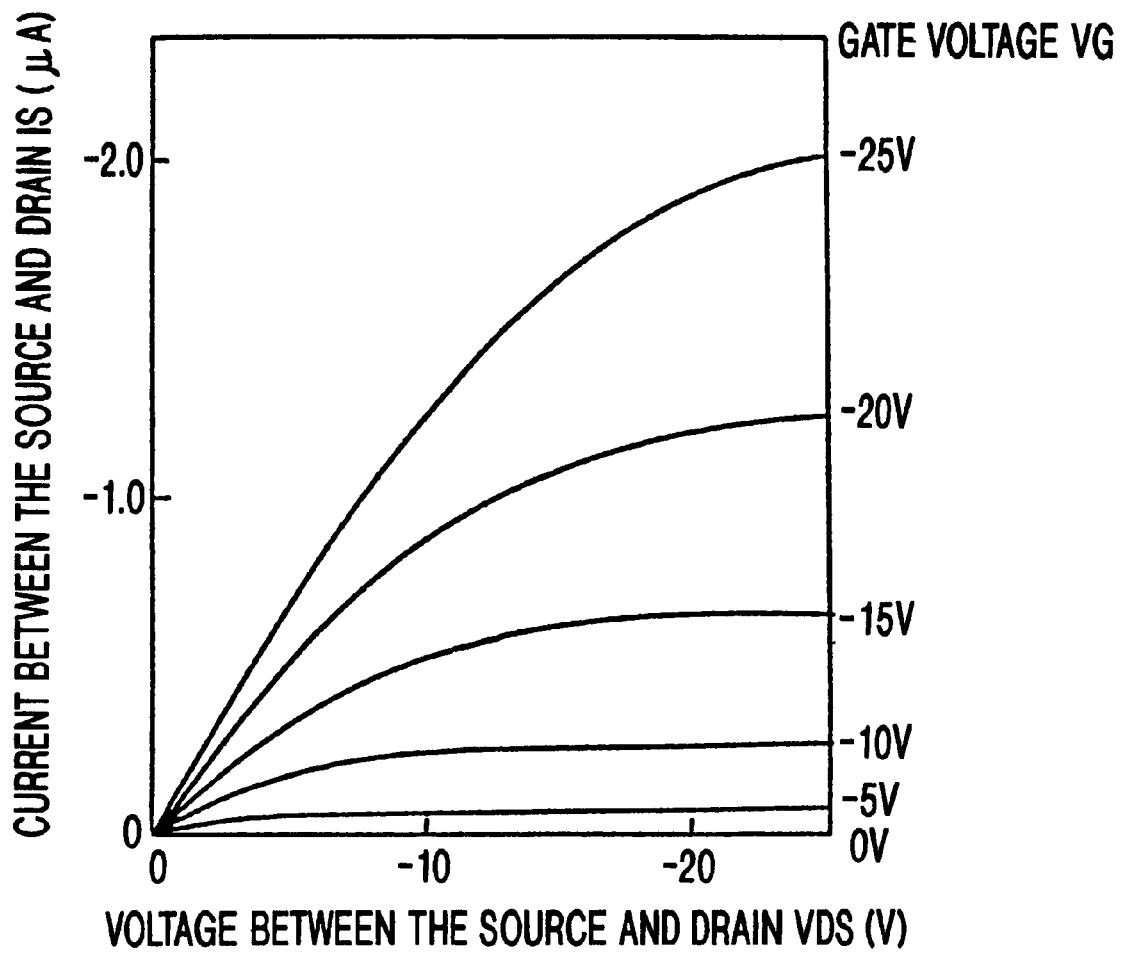
FIG. 12 is a graph showing current flow between the source and drain and as a function of the voltage between the source and drain, with gate voltage as a parameter, of an FET in a liquid crystal display apparatus according to a fifth embodiment of the invention.

FIG. 12 shows characteristics of the current between the source and drain and the voltage between the source and drain of the FET in the liquid crystal display apparatus manufactured in accordance with embodiment 5 when the gate voltage is varied. Referring to this figure, the abscissa shows the voltage ($V_{DS}$) between the source and drain and the ordinate shows the current ($I_S$) between the source and drain. In this figure, when the gate voltage of the FET is at 0 V, even if a voltage is applied between the source electrode and the drain electrode, there is almost no current flow between the source and drain. However, the more negative the gate voltage is, the larger is the current that flows between the source and drain. Since the FET is connected in series to the liquid crystal display part, when a negative voltage is applied to the gate electrode 2 and a voltage sufficient to drive the liquid crystal material 8 is applied between the transparent electrode 9 on the glass plate 10 of the liquid crystal display part and the source electrode 5 of the FET, a voltage is applied to the liquid crystal display part and then the liquid crystal material 8 is oriented so that the liquid crystal display part is driven. However, when the gate voltage is set at 0 V, a voltage is not applied to the liquid crystal display part and driving of the liquid crystal display part is stopped. More specifically, driving of the liquid crystal display is controlled by the FET in which the attached π-conjugated polymer film is the semiconductor film. In addition, the liquid crystal display apparatus manufactured in accordance with this embodiment still stably operated after more than one month.

Figure 13:
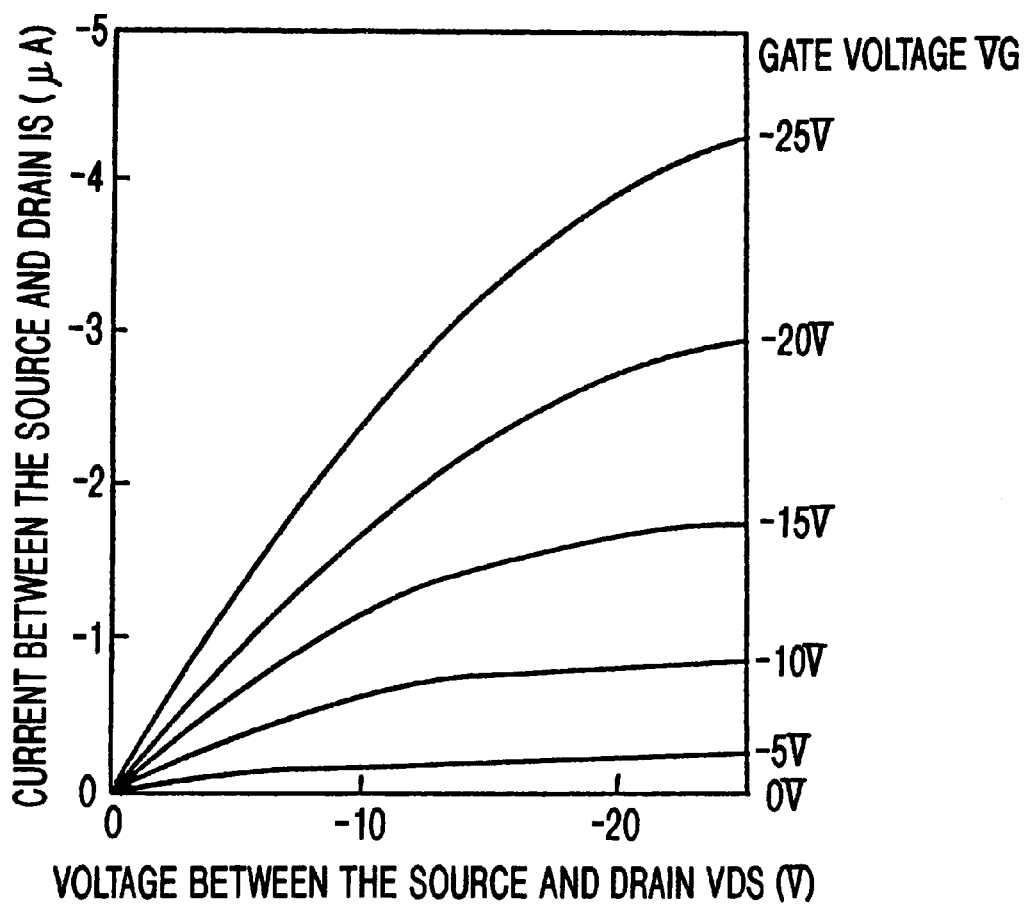
FIGS. 13 and 14 are graphs showing the same characteristics as FIG. 12 for sixth and seventh embodiments of the invention.

FIG. 13 shows characteristics of the current between the source and drain and the voltage between the source and drain when the gate voltage of the FET in the liquid crystal display apparatus manufactured in accordance with embodiment 6 is varied. Referring to this figure, the abscissa shows the voltage ($V_{DS}$) between the source and drain and the ordinate shows the current ($I_S$) between the source and drain. In this figure, when the gate voltage of the FET is 0 V, even if a voltage is applied between the source electrode and the drain electrode, there is almost no current between the source and drain. However, the more negative the gate voltage is, the larger is the current that flows between the source and drain. Since the FET is connected in series to the liquid crystal display part, when a negative voltage is applied to the gate electrode 2 and a voltage sufficient to drive the liquid crystal 8 is applied between the transparent electrode 9 on the glass plate 10 of the liquid crystal display part and the source electrode 5 of the FET, a voltage is applied to the liquid crystal display part and then the liquid crystal material 8 is oriented so that the liquid crystal display part is driven. However, when the gate voltage is at 0 V, a voltage is not applied to the liquid crystal display part and driving of the liquid crystal display part is stopped. More specifically, driving of the liquid crystal material can be controlled by the FET in which the attached LB film of π-conjugated polymer is the semiconductor film. In addition, the liquid crystal display apparatus manufactured in accordance with this embodiment has stably operated after more than one month.

Figure 14:
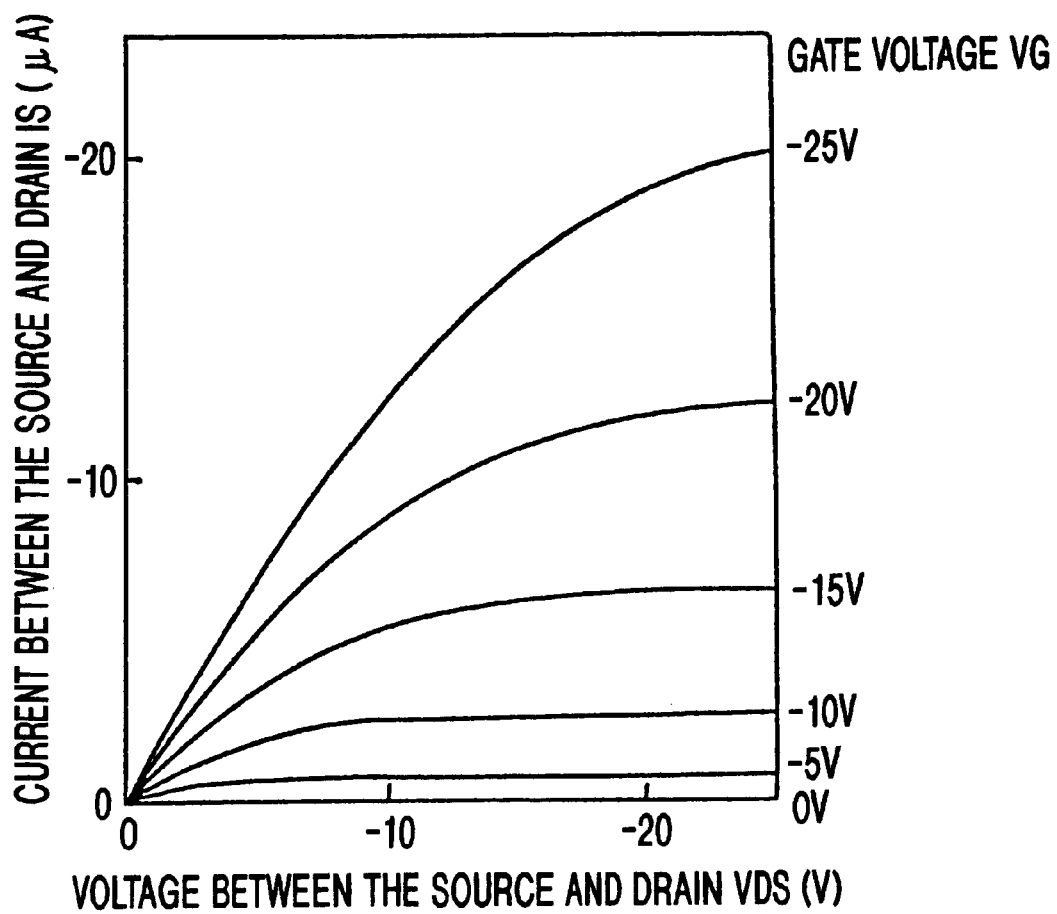
Figure 15:
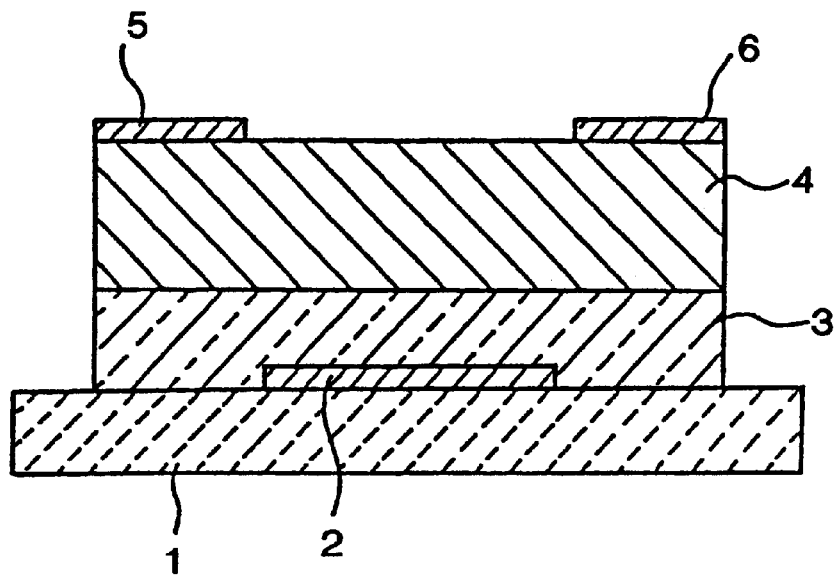
FIG. 15 is a sectional view showing a conventional FET using polyacetylene as a semiconductor layer.
Figure 16:
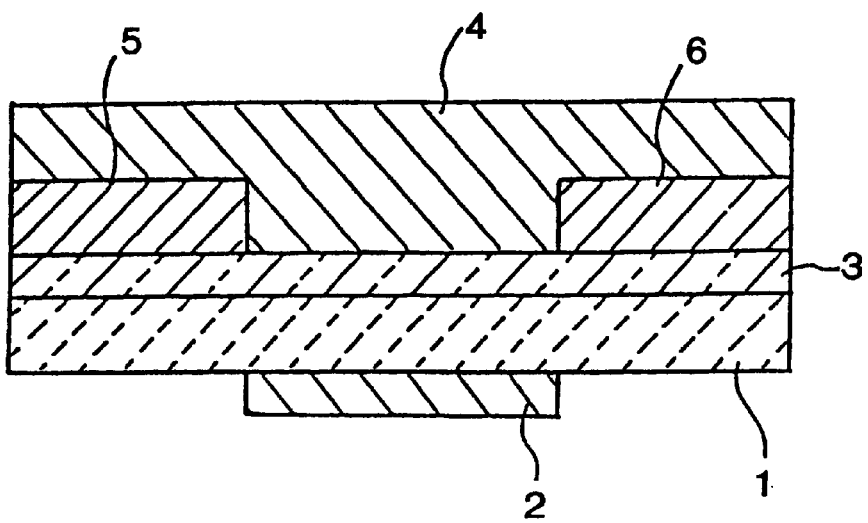
FIG. 16 is a sectional view showing a conventional FET using poly (N-methylpyrrole) or polythiophene as a semiconductor layer.

FIG. 14 shows characteristics of the current between the source and drain and the voltage between the source and drain of the FET in the liquid crystal display apparatus manufactured in accordance with embodiment 7 when the gate voltage is varied. Referring to this figure, the abscissa shows the voltage ($V_{DS}$) between the source and drain and the ordinate shows the current ($I_S$) between the source and drain. As can be seen from the figure, the current between the source and drain when the gate voltage is applied is larger than the current of embodiment 5 shown in FIG. 12, so that the characteristics are improved. In addition, similar to embodiment 5, driving of the liquid crystal material is controlled by the FET. Furthermore, the stability is also the same as in embodiment 5.

Although the liquid crystal display apparatus is made by manufacturing one FET and one liquid crystal display part in embodiments 5 to 7, it is possible to make the liquid crystal display apparatus by manufacturing a plurality of FETs and liquid crystal display parts. In this case, however, processing such as patterning using photoresist is necessary.

INDUSTRIAL APPLICABILITY

As described above, the present invention relates to a field effect transistor using an organic semiconductor and a liquid crystal display apparatus using this transistor. The invention is used in a field effect transistor or in a liquid crystal display apparatus using the transistor as a driving element.

We claim:

1. A method of fabricating a field effect transistor comprising:

forming a gate electrode on an electrically insulating substrate;

forming an electrically insulating film on the substrate covering the gate electrode;

forming source and drain electrodes on the electrically insulating film on opposite sides of the gate electrode; and forming a semiconducting film of a π-conjugated polymer having the chemical structure

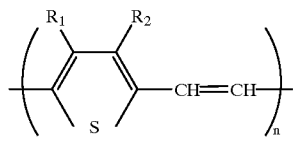

(where $R_1$ and $R_2$ are one of hydrogen, an alkyl group, and an alkoxyl group, and n is an integer equal to at least 10), covering the source and drain electrodes and on the electrically insulating film between the source and drain electrodes.

2. The method of claim 1 including forming the film of a first π-conjugated polymer by heating a film of a precursor of the first π-conjugated polymer, the precursor of the first π-conjugated polymer having the chemical structure

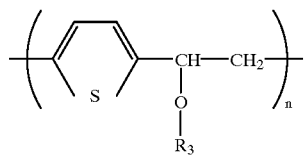

(where $R_3$ is a hydrocarbon group having 1 to 10 carbon atoms and n is an integer equal to at least 10).

3. The method of claim 2 wherein $R_3$ is $CH_3$ and the first π-conjugated polymer is poly(2,5-thienylene vinylene).

4. A method of fabricating a field effect transistor comprising:

forming a gate electrode on an electrically insulating substrate;

forming an electrically insulating film on the substrate and covering the gate electrode;

forming a semiconducting film of a π-conjugated polymer having the chemical structure

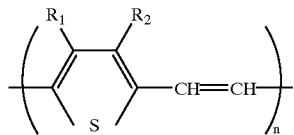

(where $R_1$ and $R_2$ are one of hydrogen, an alkyl group, and an alkoxyl group, and n is an integer equal to at least 10), on the electrically insulating film; and forming source and drain electrodes on the semiconducting film on opposite sides of the gate electrode.

5. The method of claim 4 including forming the film of a π-conjugated polymer by heating a film of a precursor of the π-conjugated polymer, the precursor of the π-conjugated polymer having the chemical structure

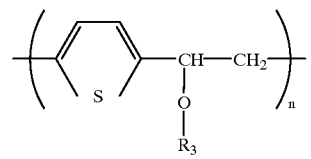

(where $R_3$ is a hydrocarbon group having 1 to 10 carbon atoms and n is an integer equal to at least 10).

6. The method of claim 5 wherein $R_3$ is $CH_3$ and the π-conjugated polymer is poly(2,5-thienylene vinylene).

7. The method of claim 2 wherein the precursor of the π-conjugated polymer includes an alkoxy group, the method including heating the precursor in an ambient including an inert gas.

8. The method of claim 7 including heating the precursor of the π-conjugated polymer to a temperature in a range of from 200 to 300° C. to produce the semiconductor film.

9. The method of claim 7 wherein the ambient includes a protonic acid vapor.

10. The method of claim 5 wherein the precursor of the π-conjugated polymer includes an alkoxy group, the method including heating the precursor in an ambient including an inert gas.

11. The method of claim 10 including heating the precursor of the π-conjugated polymer to a temperature in a range of from 200 to 300° C. to produce the semiconductor film.

12. The method of claim 10 wherein the ambient includes a protonic acid vapor.

13. The method of claim 1 wherein the source and drain electrodes are spaced apart by an opening and the gate electrode is disposed on the electrically insulating substrate opposite the opening between the source and drain electrodes.

14. The method of claim 4 wherein the source and drain electrodes are spaced apart by an opening and the gate electrode is disposed on the electrically insulating substrate opposite the opening between the source and drain electrodes.

15. A method of fabricating a field effect transistor comprising:

forming an electrically insulating film covering opposed first and second surfaces of a substrate;

forming source and drain electrodes spaced apart by an opening on the electrically insulating film opposite the first surface of the substrate;

forming a semiconducting film of a π-conjugated polymer having the chemical structure

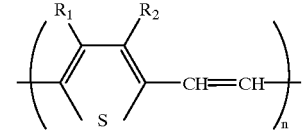

(where $R_1$ and $R_2$ are one of hydrogen, an alkyl group, and an alkoxyl group, and n is an integer equal to at least 10), covering the source and drain electrodes and the electrically insulating film in the opening between the source and drain electrodes;

removing a part of the electrically insulating film opposite the second surface of the substrate, opposite the opening between the source and drain electrodes, exposing the substrate; and forming a gate electrode on the second surface of the substrate opposite the opening between the source and drain electrodes.

16. The method of claim 15 including forming the film of a first π-conjugated polymer by heating a film of a precursor of the first π-conjugated polymer, the precursor of the first π-conjugated polymer having the chemical structure

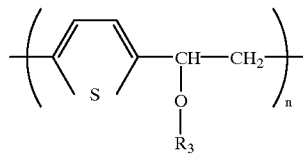

(where $R_3$ is a hydrocarbon group having 1 to 10 carbon atoms and n is an integer equal to at least 10).

17. The method of claim 16 wherein $R_3$ is $CH_3$ and the first π-conjugated polymer is poly(2,5-thienylene vinylene).

18. The method of claim 16 wherein the precursor of the π-conjugated polymer includes an alkoxy group, the method including heating the precursor in an ambient including an inert gas.

19. The method of claim 18 including heating the precursor of the π-conjugated polymer to a temperature in a range of from 200 to 300° C. to produce the semiconductor film.

20. The method of claim 18 wherein the ambient includes a protonic acid vapor.

* * * * *

UNITED STATES PATENT AND TRADEMARK OFFICE
CERTIFICATE OF CORRECTION

PATENT NO.    : 6,060,338
DATED         : May 9, 2000
INVENTOR(S)   : Tanaka et al.

Page 1 of 1

It is certified that error appears in the above-identified patent and that said Letters Patent is hereby corrected as shown below:

[63] Continuation of application No. 08/835,634, Apr. 10, 1997, Pat. No. 5,892,244, which is a continuation of application No. 07/965,536, Oct. 23, 1992, abandoned, which is a continuation of application No. 07/576,437, Oct. 24, 1990, abandoned.

[30] Jan. 10, 1989 [JP].........................................1-4177
     Jan. 10, 1990 [WO].............................PCT/JP90/00017

Signed and Sealed this

Seventh Day of August, 2001

*Attest:*

Nicholas P. Godici

*Attesting Officer*

NICHOLAS P. GODICI
*Acting Director of the United States Patent and Trademark Office*